(12) United States Patent  
Miyaya et al.

(10) Patent No.: US 11,901,162 B2  
(45) Date of Patent: Feb. 13, 2024

(54) VACUUM PROCESSING APPARATUS AND METHOD OF CLEANING VACUUM PROCESSING APPARATUS

(71) Applicant: ULVAC, Inc., Chigasaki (JP)

(72) Inventors: Takehisa Miyaya, Kanagawa (JP); Yosuke Jimbo, Kanagawa (JP); Yoshiaki Yamamoto, Kanagawa (JP); Kenji Eto, Kanagawa (JP); Yoichi Abe, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 230 days.

(21) Appl. No.: 17/420,086

(22) PCT Filed: Dec. 27, 2019

(86) PCT No.: PCT/JP2019/051474  
§ 371 (c)(1),  
(2) Date: Jun. 30, 2021

(87) PCT Pub. No.: WO2020/145207  
PCT Pub. Date: Jul. 16, 2020

(65) Prior Publication Data  
US 2022/0081774 A1     Mar. 17, 2022

(30) Foreign Application Priority Data  
Jan. 7, 2019    (JP) ................................ 2019-000529

(51) Int. Cl.  
*H01J 37/32*     (2006.01)  
*C23C 16/44*     (2006.01)  
(Continued)

(52) U.S. Cl.  
CPC .... *H01J 37/32559* (2013.01); *C23C 16/4405* (2013.01); *C23C 16/455* (2013.01);  
(Continued)

(58) Field of Classification Search  
CPC .................................................. H01J 37/3244  
See application file for complete search history.

(56) References Cited

U.S. PATENT DOCUMENTS

| | | | |
|---|---|---|---|
| 6,036,782 A | * | 3/2000 | Tanaka .................. C23C 16/455 118/715 |
| 2008/0099145 A1 | | 5/2008 | Keller |

(Continued)

FOREIGN PATENT DOCUMENTS

| | | |
|---|---|---|
| EP | 1118693 | 7/2001 |
| JP | 2002324781 A | 11/2002 |

(Continued)

OTHER PUBLICATIONS

International Search Report from related application PCT/JP2019/051474, dated Mar. 17, 2020, with English translation.

(Continued)

*Primary Examiner* — Keath T Chen  
(74) *Attorney, Agent, or Firm* — Grossman, Tucker, Perreault & Pfleger, PLLC

(57) ABSTRACT

A vacuum processing apparatus of the present invention is a vacuum processing apparatus which performs plasma processing. The vacuum processing apparatus includes an electrode flange, a shower plate, an insulating shield, a processing chamber in which a processing-target substrate is to be disposed, an electrode frame, and a slide plate. The electrode frame and the slide plate are slidable in response to thermal deformation that occurs when a temperature of the shower plate is raised or lowered. The shower plate is supported by the electrode frame using a support member penetrating through an elongated hole. The elongated hole is formed so that the support member is relatively movable in the elongated hole in response to thermal deformation that occurs when a temperature of the shower plate is raised or lowered.

5 Claims, 10 Drawing Sheets

(51) Int. Cl.
*C23C 16/455* (2006.01)
*C23C 16/505* (2006.01)

(52) U.S. Cl.
CPC ........ *C23C 16/505* (2013.01); *H01J 37/3244* (2013.01); *H01J 37/32513* (2013.01); *H01J 37/32825* (2013.01); *H01J 37/32862* (2013.01)

(56) References Cited

U.S. PATENT DOCUMENTS

2011/0139372 A1* 6/2011 Blonigan .......... H01L 21/67748
　　　　　　　　　　　　　　　　　　　　　　　　118/715
2019/0055651 A1 2/2019 Jinbo et al.

FOREIGN PATENT DOCUMENTS

| JP | A-2005-256172 | 9/2005 |
|---|---|---|
| JP | A-2007-123840 | 5/2007 |
| JP | 2008270721 A | 11/2008 |
| JP | 2009010101 A | 1/2009 |
| JP | B-4430253 | 3/2010 |
| JP | 2011009249 A | 1/2011 |
| JP | A-2011-086822 | 4/2011 |
| JP | A-2019-173128 | 10/2019 |
| KR | 1020110013631 A | 2/2011 |
| KR | 1020120011612 A | 2/2012 |
| TW | 200611386 A | 4/2006 |
| TW | 200644119 A | 12/2006 |
| TW | I287279 | 9/2007 |
| TW | I290962 | 12/2007 |
| WO | 2010/079753 | 7/2010 |
| WO | 2010/079756 | 7/2010 |
| WO | 2011/146571 | 11/2011 |
| WO | 2015/116430 | 8/2015 |

OTHER PUBLICATIONS

Office Action from related Taiwan application 108148190 dated May 24, 2021, with English translation of Search Report.
Office Action from related Chinese Appln. No. 201980087734.9, dated Nov. 11, 2023. English translation attached. 9 pages.

* cited by examiner

VACUUM PROCESSING APPARATUS AND METHOD OF CLEANING VACUUM PROCESSING APPARATUS

TECHNICAL FIELD

The present invention relates to a vacuum processing apparatus and a method of cleaning the vacuum processing apparatus, and more particularly to a technology suitable for use in performing a film deposition processing or the like using a plasma.

Priority is claimed on Japanese Patent Application No. 2019-000529 filed in Japan on Jan. 7, 2019, the content of which is incorporated herein by reference.

BACKGROUND ART

Conventionally, as processing using a plasma, a plasma processing apparatus which performs a surface treatment on a substrate such as film deposition, particularly plasma chemical vapor deposition (CVD), or etching is known. In the plasma processing apparatus, a processing chamber is constituted to include an insulating flange sandwiched between a chamber and an electrode flange such that it has a film deposition space (reaction chamber). In the processing chamber, a shower plate connected to the electrode flange and having a plurality of ejection ports and a heater on which a substrate is disposed are provided.

A space formed between the shower plate and the electrode flange is a gas introduction space into which a source gas is introduced. That is, the shower plate partitions the inside of the processing chamber into a film deposition space in which a film is formed on the substrate and a gas introduction space.

A high-frequency power supply is connected to the electrode flange. The electrode flange and the shower plate function as a cathode electrode.

Patent Documents 1 and 2 describe a configuration in which a circumference of a shower plate is directly connected to an electrode flange.

In such a configuration, since a processing temperature is high during plasma processing, the shower plate thermally expands and then contracts when the temperature is lowered such as at the end of processing.

Also, in such a configuration, cleaning for removing deposits adhered to a film deposition space is appropriately performed at the end of plasma processing.

PRIOR ART DOCUMENTS

Patent Documents

[Patent Document 1] PCT International Publication No. WO 2010/079756
[Patent Document 2] PCT International Publication No. WO 2010/079753
[Patent Document 3] Japanese Patent No. 4430253

SUMMARY OF THE INVENTION

Problems to be Solved by the Invention

In recent years, since the size of substrates has come to be large in manufacturing flat panel displays (FPDs) such as liquid crystal displays or organic electroluminescence (EL) displays, or the like, a size (area) of a shower plate has also become large. Therefore, when a large area substrate that constitutes an FPD having a side equal to or larger than 1800 mm or the like is processed, thermal expansion and thermal contraction of a shower plate become extremely large. The thermal expansion and thermal contraction of the shower plate may reach several cm to tens of cm at corner portions of the substrate.

However, conventional technologies do not pay attention to a problem caused by thermal expansion and thermal contraction of the shower plate, and there have been cases in which the number of times a member supporting the shower plate can be used is reduced. Particularly, when deformation of the member is significant, there has been a problem in that the member has had to be disposed of each time maintenance work is performed.

Also, the member supporting the shower plate may be rubbed according to the thermal expansion and thermal contraction of the shower plate, and particles or the like may be generated due to scratching of the member. This becomes a cause of generation of defects in plasma processing, and there is a demand to solve the problem.

Therefore, it is conceivable to cause an electrode flange and a shower plate to slide with each other to maintain a sealed state during thermal deformation of the shower plate. Such a configuration example is described in Patent Document 3.

However, in the technology of Patent Document 3, sealing was insufficient.

Therefore, the present inventors studied a structure in which a support member such as a bolt is vertically provided with respect to a main surface of an electrode flange from the electrode flange side toward a shower plate, and the support member such as a bolt is configured to be slidable inside an elongated hole provided in the shower plate.

In this case, a configuration in which support of the shower plate with respect to the electrode flange is satisfactorily maintained is found.

However, corrosion will progress during cleaning when a cleaning gas comes into contact with a region close to the elongated hole or components sliding with each other. This causes generation of particles. There is a demand to solve such a problem.

A shower plate is a member that ejects a source gas into a film deposition space. Therefore, an amount of deposits adhered to the shower plate is large compared to that of other members. Therefore, a processing time in cleaning, that is, an exposure time in which the shower plate is exposed to a cleaning gas needs to be increased. Therefore, progressing of corrosion becomes faster.

In order to eliminate generation of particles due to such corrosion, for example, the shower plate and components positioned close to the shower plate need to be replaced sooner.

Furthermore, even when the shower plate and components positioned close to the shower plate are made of a material having corrosion resistance, corrosion due to a cleaning gas will occur over the long term. Therefore, a service life of a component, that is, a replacement time will be shortened. There is a demand for a solution to this.

The present invention has been made in view showing the above circumstances and is intended to achieve the following objectives.

1. Preventing occurrence of corrosion due to a cleaning gas.
2. Improving sealing of a gas for preventing gas leakage from around a shower plate.

3. Prolonging service lives of components.

Means for Solving the Problems

A vacuum processing apparatus of the present invention is a vacuum processing apparatus which performs plasma processing and includes an electrode flange connected to a high-frequency power supply, a shower plate spaced apart from and facing the electrode flange and serving as a cathode together with the electrode flange, an insulating shield provided around the shower plate, a processing chamber in which a processing-target substrate is to be disposed in an opposite side of the shower plate opposite with respect to the electrode flange, an electrode frame attached to the shower plate side of the electrode flange, and a slide plate attached to a circumferential edge portion of the shower plate on the electrode frame side, in which the electrode frame and the slide plate are slidable in response to thermal deformation that occurs when a temperature of the shower plate is raised or lowered, and a space surrounded by the shower plate, the electrode flange, and the electrode frame is sealable, the shower plate is supported by the electrode frame using a support member penetrating through an elongated hole provided in the circumferential edge portion of the shower plate, the elongated hole is formed so that the support member is relatively movable in the elongated hole in response to thermal deformation that occurs when a temperature of the shower plate is raised or lowered, a gas hole which communicates with the elongated hole to supply a purge gas is provided in the elongated hole, and the gas hole communicates with a space surrounded by the shower plate, the electrode flange, the electrode frame, and the slide plate. Therefore, the above-described problems were solved.

In the vacuum processing apparatus of the present invention, the gas hole may be formed to axially penetrate through the support member which penetrates through the elongated hole.

The vacuum processing apparatus of the present invention may further include a lid which closes an opening of the elongated hole, in which the lid may include a force-applying portion which applies a force to the lid such that it does not come away from the elongated hole when the opening of the elongated hole is closed.

In the vacuum processing apparatus of the present invention, a portion exposed to a cleaning gas may be subjected to a corrosion resistance surface treatment at the time of cleaning the processing chamber.

A method of cleaning a vacuum processing apparatus of the present invention is a method of cleaning the vacuum processing apparatus according to any one of the above and includes supplying a purge gas into a space surrounded by the shower plate, the electrode flange, the electrode frame, and the slide plate (purge step), supplying a purge gas to the elongated hole through the gas hole (purge gas sealing step), supplying a cleaning gas to the processing chamber (cleaning step), and supplying the cleaning gas to the processing chamber (performing the cleaning step) after the purge gas is supplied (after the purge gas sealing step).

A vacuum processing apparatus of the present invention is a vacuum processing apparatus which performs plasma processing and includes an electrode flange connected to a high-frequency power supply, a shower plate spaced apart from and facing the electrode flange and serving as a cathode together with the electrode flange, an insulating shield provided around the shower plate, a processing chamber in which a processing-target substrate is to be disposed in an opposite side of the shower plate opposite with respect to the electrode flange, an electrode frame attached to the shower plate side of the electrode flange, and a slide plate attached to a circumferential edge portion of the shower plate on the electrode frame side, in which the electrode frame and the slide plate are slidable in response to thermal deformation that occurs when a temperature of the shower plate is raised or lowered, and a space surrounded by the shower plate, the electrode flange, and the electrode frame is sealable, the shower plate is supported by the electrode frame using a support member penetrating through an elongated hole provided in the circumferential edge portion of the shower plate, the elongated hole is formed so that the support member is relatively movable in the elongated hole in response to thermal deformation that occurs when a temperature of the shower plate is raised or lowered, a gas hole which communicates with the elongated hole to supply a purge gas is provided in the elongated hole, and the gas hole communicates with a space surrounded by the shower plate, the electrode flange, the electrode frame, and the slide plate.

Therefore, a purge gas can be supplied to the inside of the elongated hole from a space between the shower plate and the electrode flange.

Therefore, at the time of purging the space between the shower plate and the electrode flange during cleaning, the inside of the elongated hole can be purged at the same time, and therefore a cleaning gas can be prevented from entering the inside of the elongated hole. Therefore, it is possible to prevent occurrence of corrosion due to the cleaning gas inside the elongated hole and around the elongated hole. Therefore, generation of particles can be reduced, and an adverse influence on film deposition characteristics can be reduced.

Particularly, when the shower plate is thermally deformed, since the elongated hole is positioned close to a portion that slides, there has been a concern about generation of particles from the sliding portion or the like, but the concern can be eliminated.

In the vacuum processing apparatus of the present invention, the gas hole may be formed to axially penetrate through the support member which penetrates through the elongated hole.

Therefore, a purge gas can be supplied to the inside of the elongated hole from the space between the shower plate and the electrode flange through the gas hole that penetrates to connect an end portion on the electrode frame side and an end portion on the elongated hole side in the support member.

Here, it is preferable to form the gas hole over the entire length of the support member and coaxially with the support member.

Also, it is possible to easily supply a purge gas to the elongated hole at the time of cleaning an existing vacuum processing apparatus simply by replacing the support member such as a stepped bolt in which a gas hole is formed as described above.

The vacuum processing apparatus of the present invention may further include a lid which closes an opening of the elongated hole, in which the lid may include a force-applying portion which applies a force to the lid such that it does not come away from the elongated hole when the opening of the elongated hole is closed.

Therefore, when the opening of the elongated hole on the processing chamber side is closed by the lid, it is possible to prevent a cleaning gas from entering the inside of the elongated hole from the processing chamber side during cleaning.

Also, in a state during plasma processing, even when the lid is attached to the opening of the elongated hole which is a lower surface of the shower plate, the lid can easily be maintained such that it does not fall off using the force-applying portion (biasing member).

In the present invention, a portion exposed to a cleaning gas may be subjected to a corrosion resistance surface treatment at the time of cleaning the processing chamber.

Therefore, corrosion resistance in the portion exposed to the cleaning gas can be improved and thus generation of particles can be prevented.

Here, a corrosion resistance surface treatment can be set according to types of cleaning gases. For example, $NF_3$ (nitrogen trifluoride) may be used as the cleaning gas to perform cleaning of the inside of the processing chamber using F radicals generated therefrom. In this case, yttria coating, that is, processing of forming a $Y_2O_3$ thin film can be used as the corrosion resistance surface treatment. The $Y_2O_3$ thin film can be formed using chemical vapor deposition (CVD) processing.

Furthermore, when a component to which the yttria coating is applied is an alloy containing nickel or the like or an alloy containing aluminum or the like, an electrolytic polishing treatment or a surface diffusion treatment can be performed prior to the yttria coating to further improve corrosion resistance.

Here, a component made of a nickel alloy such as Inconel (registered trademark), Hastelloy (registered trademark), or the like can be the object. Particularly, in a case of a component made of Hastelloy, it is preferable to perform a surface diffusion treatment. Also, in a case of a component made of Inconel, it is preferable to perform an electrolytic polishing treatment.

Furthermore, as components to which such surface treatments are applied, high-temperature strength members such as sliding components, particularly the electrode frame and the slide plate, support members such as the stepped bolt, a washer, or the like can be exemplified.

Also, a method of cleaning a vacuum processing apparatus of the present invention is a method of cleaning the vacuum processing apparatus according to any one of the above and includes supplying a purge gas into a space surrounded by the shower plate, the electrode flange, the electrode frame, and the slide plate (purge step), supplying a purge gas to the elongated hole through the gas hole (purge gas sealing step), supplying a cleaning gas to the processing chamber (cleaning step), and supplying the cleaning gas to the processing chamber (performing the cleaning step) after the purge gas is supplied (after the purge gas sealing step).

Therefore, the inside of the elongated hole formed in the shower plate is filled with a purge gas before the shower plate is exposed to a cleaning gas in the cleaning processing. Then, the inside of the elongated hole can be in a sealed state. A cleaning gas can be prevented from entering the inside of the sealed elongated hole.

Therefore, the inside of the elongated hole, the support member such as the stepped bolt exposed inside the elongated hole, the washer, or components configured to be slidable and at positions communicating with the inside of the elongated hole can be prevented from being exposed to the cleaning gas. Therefore, generation of particles can be prevented.

Effects of the Invention

According to the present invention, corrosion resistance of surfaces of components inside the elongated hole formed in the shower plate, and components positioned inside the elongated hole, and furthermore, components at positions communicating with the elongated hole can be improved. Also, surfaces of these components are prevented from being exposed to a cleaning gas. Therefore, effects can be achieved such that generation of particles can be reduced.

EMBODIMENTS FOR CARRYING OUT THE INVENTION

Hereinafter, a vacuum processing apparatus and a method of cleaning the vacuum processing apparatus according to a first embodiment of the present invention will be described with reference to the drawings.

Figure 1:
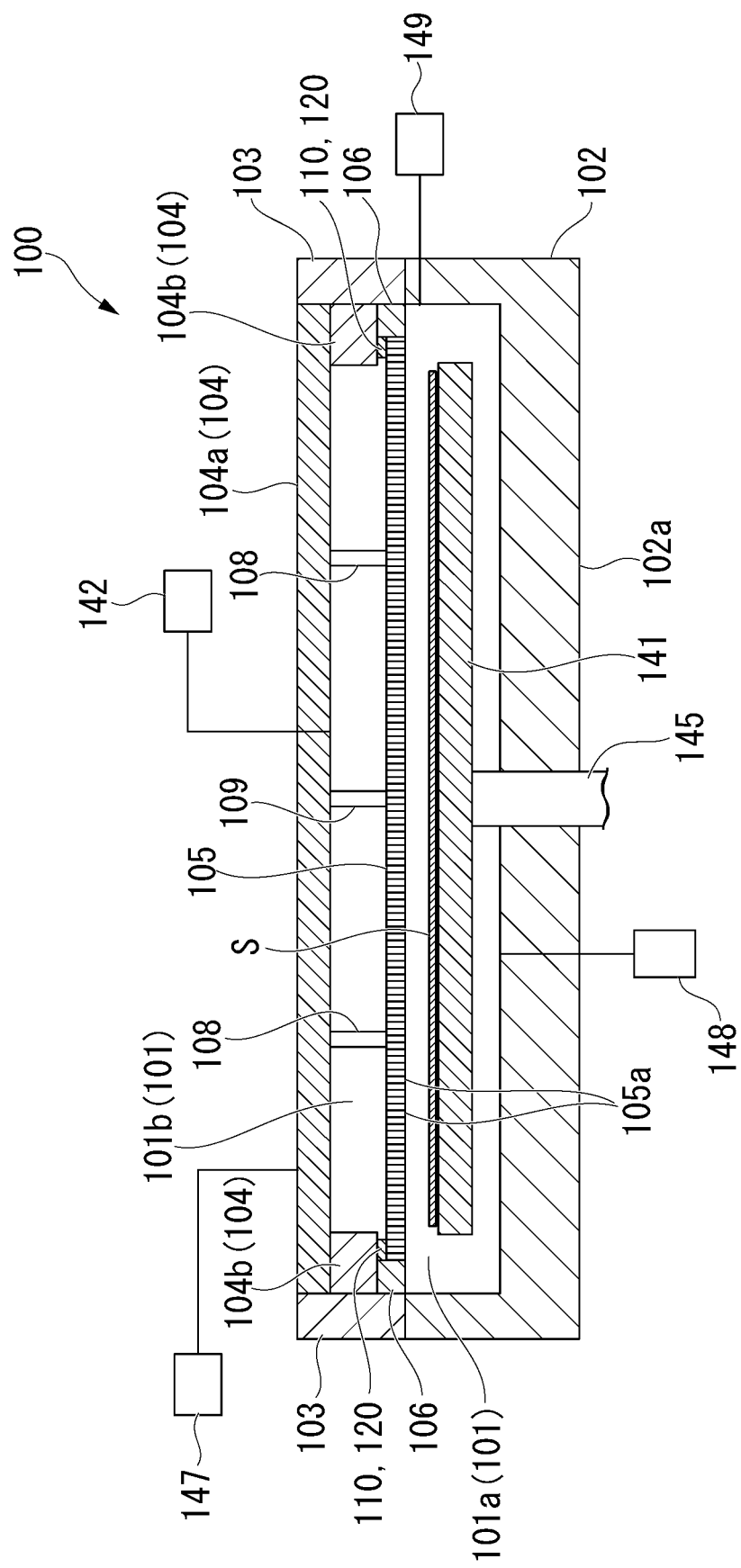
FIG. 1 is a schematic cross-sectional view showing a vacuum processing apparatus according to a first embodiment of the present invention.

FIG. 1 is a schematic cross-sectional view showing a vacuum processing apparatus of the present embodiment, and reference numeral 100 in FIG. 1 indicates a vacuum processing apparatus.

In the present embodiment, a film deposition apparatus using a plasma chemical vapor deposition (CVD) method as plasma processing will be described.

The vacuum processing apparatus 100 according to the present embodiment performs film deposition on a substrate (processing-target substrate) S using a plasma CVD method.

As shown in FIG. 1, the vacuum processing apparatus 100 according to the present embodiment includes a processing chamber 101 having a film deposition space 101a serving as a reaction chamber. The processing chamber 101 is constituted by a vacuum chamber 102 (chamber), an electrode flange 104, and an insulating flange 103 sandwiched between the vacuum chamber 102 and the electrode flange 104.

An opening is formed at a bottom portion 102a (inner bottom surface) of the vacuum chamber 102. A support column 145 is inserted through the opening, and the support column 145 is disposed at a lower portion of the vacuum chamber 102. A plate-shaped support portion (heater) 141 is connected to a distal end (in the vacuum chamber 102) of the support column 145.

Also, a vacuum pump (evacuation means) 148 is provided for the vacuum chamber 102 via an evacuation pipe. The vacuum pump 148 depressurizes the vacuum chamber 102 so that the inside of the vacuum chamber 102 reaches a vacuum state.

Also, the support column 145 is connected to a lifting mechanism (not shown in drawings) provided outside the vacuum chamber 102 and is vertically movable in a vertical direction with respect to the substrate S.

Also, a cleaning gas supply unit 149 is provided to the vacuum chamber 102 via a supply pipe. The cleaning gas supply unit 149 can eject a cleaning gas, which will be described below, to the inside of the vacuum chamber 102, particularly into the film deposition space 101a to clean deposits adhered to the film deposition space 101a side.

An opening of the supply pipe in the cleaning gas supply unit 149 is disposed close to an edge portion of a shower plate 105.

The electrode flange 104 includes an upper wall 104a and a circumferential wall 104b. The electrode flange 104 is disposed such that an opening of the electrode flange 104 is positioned on a downward side in the vertical direction with respect to the substrate S. Also, the shower plate 105 is attached in the opening of the electrode flange 104.

Therefore, a space 101b (gas introduction space) is formed between the electrode flange 104 and the shower plate 105. Also, the upper wall 104a of the electrode flange 104 faces the shower plate 105. A gas supply unit 142 (gas supply means) is connected to the upper wall 104a via a gas introduction port.

The space 101b functions as a gas introduction space into which a process gas is introduced from the gas supply unit 142.

The electrode flange 104 and the shower plate 105 are formed of a conductive material and are made of a metal such as, for example, aluminum.

An electrode mask 107 is disposed on a surface of the shower plate 105 on the space 101b side to cover a circumferential edge portion thereof.

The electrode mask 107 is attached to an insulating shield 106.

A shield cover is provided around the electrode flange 104 to cover the electrode flange 104. The shield cover is not in contact with the electrode flange 104 and is disposed to be continuous with a circumferential edge portion of the vacuum chamber 102.

Also, a radio frequency (RF) power supply 147 (high-frequency power supply) provided outside the vacuum chamber 102 is connected to the electrode flange 104 via a matching box. The matching box is attached to the shield cover and the vacuum chamber 102 is grounded via the shield cover.

The electrode flange 104 and the shower plate 105 are configured as a cathode electrode. A plurality of gas ejection ports 105a are formed in the shower plate 105. A process gas introduced into the space 101b is ejected from the gas ejection ports 105a to the film deposition space 101a in the vacuum chamber 102.

At the same time, the electrode flange 104 and the shower plate 105 that are supplied with power from the RF power supply 147 serve as a cathode electrode, and a plasma is generated in the film deposition space 101a to perform processing such as film deposition.

Figure 2:
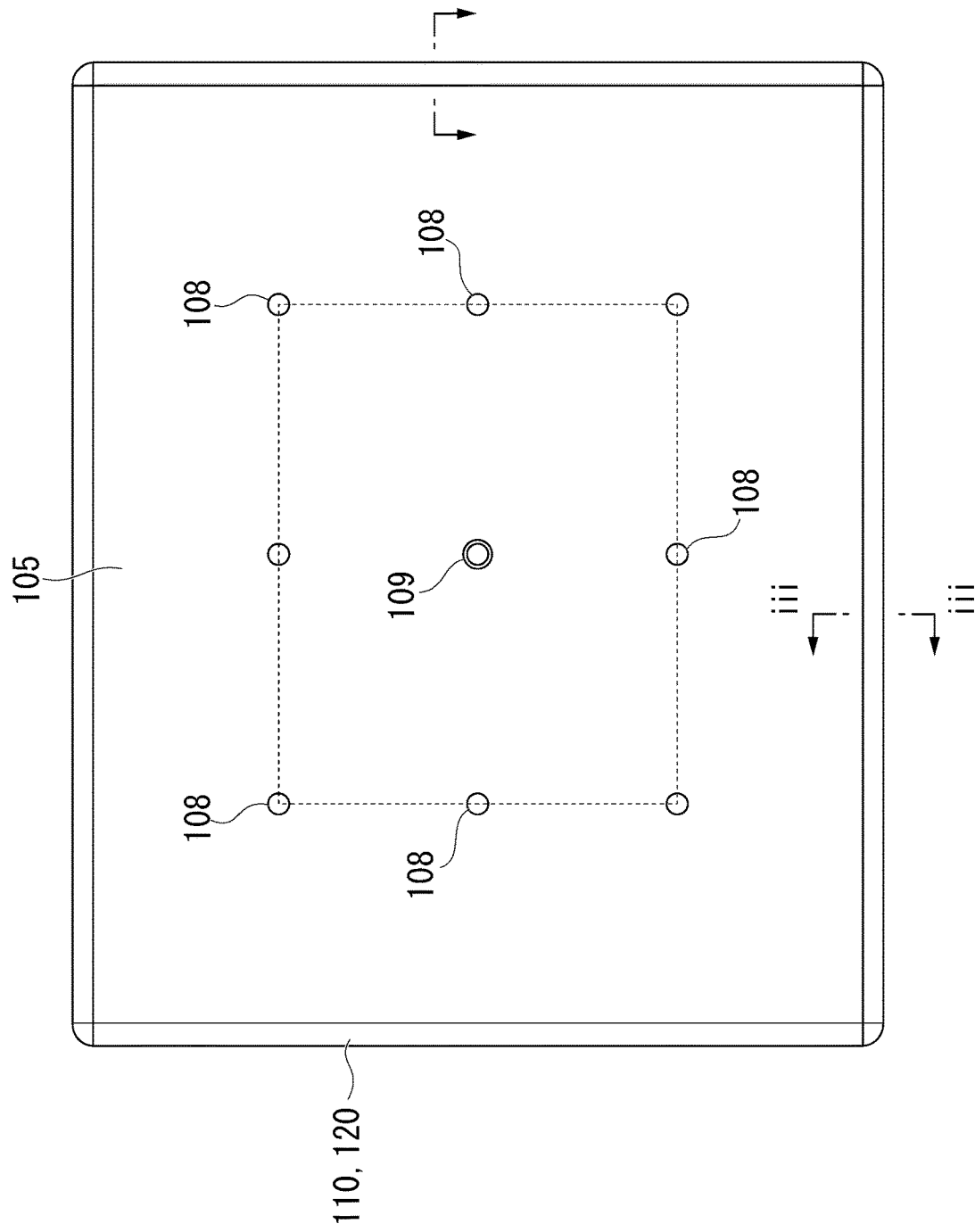
FIG. 2 is a top view showing a shower plate in the vacuum processing apparatus according to the first embodiment of the present invention.

FIG. 2 is a top view showing the shower plate 105 in the present embodiment in a plan view.

The shower plate 105 is supported to be suspended downward from the electrode flange 104 by a rod-shaped fixed shaft 109 and movable shafts 108.

The fixed shaft 109 is fixedly attached to a center position of the shower plate 105 in a plan view. The movable shafts 108 are disposed at vertexes and midpoints of four sides of a rectangle with the fixed shaft 109 as a center.

Unlike the fixed shaft 109, the movable shafts 108 have a structure that moves in response to thermal expansion of the shower plate 105. Specifically, the movable shafts 108 are connected to the shower plate 105 via spherical bushes provided at lower ends of the movable shafts 108. The movable shafts 108 can support the shower plate 105 while moving in accordance with deformation of the shower plate 105 in a horizontal direction.

Figure 3:
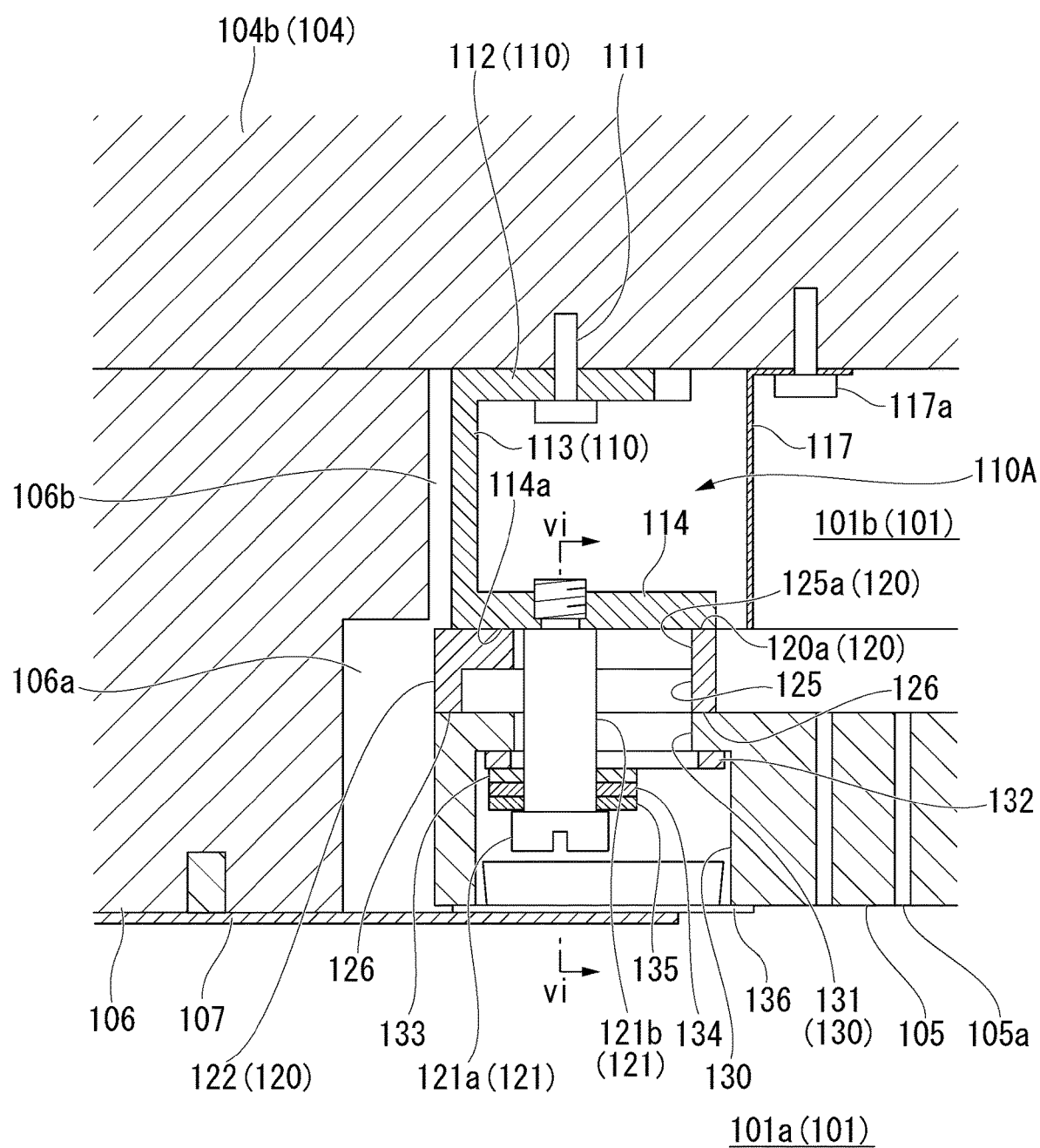
FIG. 3 is a cross-sectional view showing an electrode frame, a slide plate, and an edge portion of the shower plate in the vacuum processing apparatus according to the first embodiment of the present invention.

FIG. 3 is an enlarged cross-sectional view showing a region including an edge portion of the shower plate 105 according to the present embodiment.

The insulating shield 106 is circumferentially provided at an outer position of a circumferential edge portion of the shower plate 105 to be spaced apart from the edge portion of the shower plate 105. The insulating shield 106 is attached to the circumferential wall 104b of the electrode flange 104. A thermal expansion absorption space (gap) 106a is formed at an inner position of the insulating shield 106 and an outer position of a circumferential end surface of the shower plate 105.

As shown in FIG. 3, an electrode frame 110 and a slide plate 120 are circumferentially provided on an upper side of the circumferential edge portion of the shower plate 105.

As shown in FIG. 3, the electrode frame 110 is attached to a lower side of the circumferential wall 104b of the electrode flange 104 using a support member 111 such as a bolt. The electrode frame 110 is circumferentially provided at a position inside the insulating shield 106. The electrode frame 110 is circumferentially provided at a position corresponding to an outer outline of the gas introduction space 101b in a plan view.

As shown in FIGS. 2 and 3, the slide plate 120 is circumferentially provided in the circumferential edge portion of the shower plate 105 to substantially overlap the electrode frame 110 in a plan view. The slide plate 120 is attached to the shower plate 105. The shower plate 105 and the electrode frame 110 are slidable with each other.

The edge portion of the shower plate 105 is supported to be suspended by the electrode frame 110 using a stepped bolt 121.

The stepped bolt 121 penetrates through the shower plate 105 and the slide plate 120 from below, and a distal end thereof is fastened to the electrode frame 110.

The slide plate 120 is positioned between the electrode frame 110 and the shower plate 105. The slide plate 120 is movable in a direction parallel to the surface of the shower plate 105 integrally with the edge portion of the shower plate 105 in response to thermal deformation that occurs when a temperature of the shower plate 105 is raised or lowered.

As shown in FIGS. 1 to 3, the electrode frame 110 allows the slide plate 120 to be slid and moved so that a slide position thereof changes in response to thermal deformation of the shower plate 105 that occurs when a temperature of the shower plate 105 is raised or lowered.

The electrode frame 110 and the slide plate 120 serve as a sealing side wall of the gas introduction space 101b surrounded by the shower plate 105 and the electrode flange 104.

As shown in FIG. 3, even when the slide plate 120 attached to the shower plate 105 and the electrode frame 110 attached to the electrode flange 104 corresponding to the slide plate 120 slide, the electrode frame 110 and the slide plate 120 are maintained in a state of being in contact with each other.

Therefore, the electrode frame 110 and the slide plate 120 can seal the gas introduction space 101b even when they slide with each other.

The electrode frame 110 and the slide plate 120 electrically connect the circumferential edge portion of the shower plate 105 to the electrode flange 104.

As shown in FIG. 2, the electrode frame 110 has a rectangular outline that is substantially the same outer outline as the circumferential edge portion of the shower plate 105 in a plan view. Also, the electrode frame 110 has substantially the same width around the shower plate 105. The electrode frame 110 is made of a metal such as, for example, Hastelloy.

As shown in FIG. 2, similarly to the electrode frame 110, the slide plate 120 has a rectangular outline that is substantially the same outer outline as the circumferential edge portion of the shower plate 105 in a plan view. Also, the slide plate 120 has substantially the same width around the shower plate 105. The slide plate 120 can be made of the same material as the electrode frame 110, for example, a metal such as Hastelloy.

As shown in FIG. 3, the electrode frame 110 includes an upper plate surface portion (fixed portion) 112, a vertical plate surface portion (wall portion) 113, and a lower plate surface portion (base portion) 114.

The upper plate surface portion (fixed portion) 112 is fixedly attached to a lower surface of the electrode flange 104 facing the shower plate 105.

The vertical plate surface portion (wall portion) 113 is provided to stand toward the shower plate 105 from the entire circumference of an outer end portion of an outline of the upper plate surface portion (fixed portion) 112.

The lower plate surface portion (base portion) 114 extends substantially parallel to the upper plate surface portion (fixed portion) 112 from a lower end of the vertical plate surface portion (wall portion) 113.

The electrode frame 110 is formed to have a U-shape in a cross-sectional shape perpendicular to an outline of the shower plate 105 by the upper plate surface portion (fixed portion) 112, the vertical plate surface portion (wall portion) 113, and the lower plate surface portion (base portion) 114. The electrode frame 110 is formed to have an internal space 110A inside the U-shape by the upper plate surface portion (fixed portion) 112, the vertical plate surface portion (wall portion) 113, and the lower plate surface portion (base portion) 114.

The upper plate surface portion (fixed portion) 112 is attached to the circumferential wall 104b of the electrode flange 104 using the support member 111 such as a bolt. The support member 111 penetrates through the upper plate surface portion (fixed portion) 112.

The vertical plate surface portion (wall portion) 113 is provided to stand substantially vertically toward a main surface of the shower plate 105 from the electrode flange 104. An upper end of the vertical plate surface portion (wall portion) 113 is connected to an end portion of the upper plate surface portion (fixed portion) 112 over the entire outer circumference of an outline of the electrode frame 110.

The vertical plate surface portion (wall portion) 113 is disposed on an inward side of the insulating shield 106. The vertical plate surface portion (wall portion) 113 faces an inner circumferential surface of the insulating shield 106.

An outer circumferential surface of a circumferential edge portion of the vertical plate surface portion (wall portion) 113 is spaced apart from the inner circumferential surface of the insulating shield 106. A gap 106b is formed between the outer circumferential surface of the circumferential edge portion of the vertical plate surface portion (wall portion) 113 and the inner circumferential surface of the insulating shield 106.

Here, the electrode frame 110 is attached to the electrode flange 104 and is a low temperature side. Therefore, thermally expanded lengths of the electrode frame 110 expected when a temperature is raised are smaller than thermally expanded lengths of the shower plate 105 and the slide plate 120 expected when a temperature is raised.

Therefore, the gap 106b is set to be smaller than the thermal expansion absorption space 106a. That is, a distance between the outer circumferential surface of the vertical plate surface portion (wall portion) 113 and the inner circumferential surface of the insulating shield 106 is set to be smaller than a distance between an outer circumferential end surface of the shower plate 105 and the inner circumferential surface of the insulating shield 106.

A step is formed on the inner circumferential surface of the insulating shield 106 to correspond to the gap 106b and the thermal expansion absorption space 106a. The step is formed on the electrode frame 110 side with respect to a sliding seal surface 114a and a sliding seal surface 120a which are contact positions between the slide plate 120 and the electrode frame 110.

The lower end of the vertical plate surface portion (wall portion) 113 is connected to an end portion on an outer circumferential side of the lower plate surface portion (base portion) 114.

The lower plate surface portion (base portion) 114 is disposed toward a center side of the gas introduction space 101b from the lower end of the vertical plate surface portion (wall portion) 113. That is, the lower plate surface portion (base portion) 114 extends toward an inward side of the outline of the electrode frame 110 from the lower end of the vertical plate surface portion (wall portion) 113. The lower plate surface portion (base portion) 114 extends parallel to the upper plate surface portion (fixed portion) 112.

The lower plate surface portion (base portion) 114 has substantially the same width over the entire circumference of the shower plate 105.

A plate thickness of the lower plate surface portion (base portion) 114 can be set to be larger than a plate thickness of the upper plate surface portion (fixed portion) 112.

A lower surface of the lower plate surface portion (base portion) 114 on the shower plate 105 side is the sliding seal surface 114a that is parallel to the main surface of the shower plate 105.

The sliding seal surface 114a is in contact with the sliding seal surface 120a provided on an upper surface of the slide plate 120.

The sliding seal surface 114a is an entire region of the lower surface of the lower plate surface portion (base portion) 114 on the shower plate 105 side.

The stepped bolt 121 is screwed to the lower plate surface portion (base portion) 114 from below.

As shown in FIG. 3, a plate-shaped reflector 117 is provided on an inner circumferential side of the electrode frame 110 over the entire circumference thereof. The reflector 117 is provided at four locations parallel to outline sides of the shower plate 105 having a rectangular outline. The reflector 117 is disposed close to the inner circumferential side of the electrode frame 110.

The reflector 117 is a metal plate bent in an L shape. An upper end of the reflector 117 is bent to the center side of the gas introduction space 101b. A portion bent at the upper end of the reflector 117 is attached to the circumferential wall 104b of the electrode flange 104 using a screw 117a. An outward side of the upper end of the reflector 117 is disposed close to an inner distal end of the upper plate surface portion (fixed portion) 112 of the electrode frame 110.

A lower end of the reflector 117 is positioned close to an inner end of the lower plate surface portion (base portion) 114 of the electrode frame 110.

Therefore, the reflector 117 is disposed to be spaced apart from and face an opening of the internal space 110A of the electrode frame 110 which is U-shaped in a cross-sectional view. Furthermore, the lower end of the reflector 117 and the inner end of the lower plate surface portion (base portion) 114 of the electrode frame 110 are not connected. Therefore, a gas can easily enter the internal space 110A of the electrode frame 110 from the gas introduction space 101b.

Figure 4:
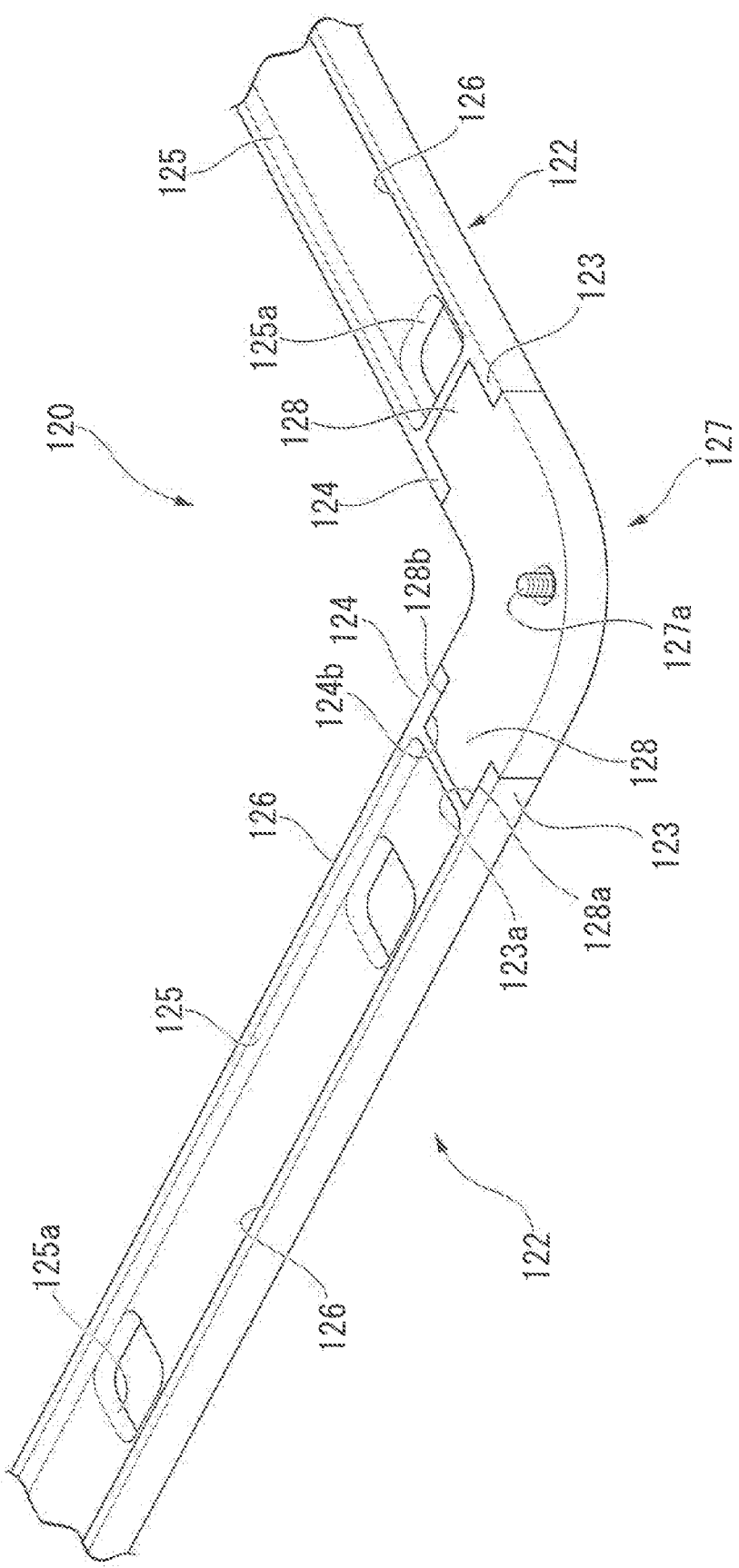
FIG. 4 is a partial perspective view showing a lower surface side of a region including a corner portion of the slide plate in the vacuum processing apparatus according to the first embodiment of the present invention.

FIG. 4 is an enlarged perspective view showing a corner portion on a lower surface side of the slide plate 120 in the present embodiment.

Figure 5:
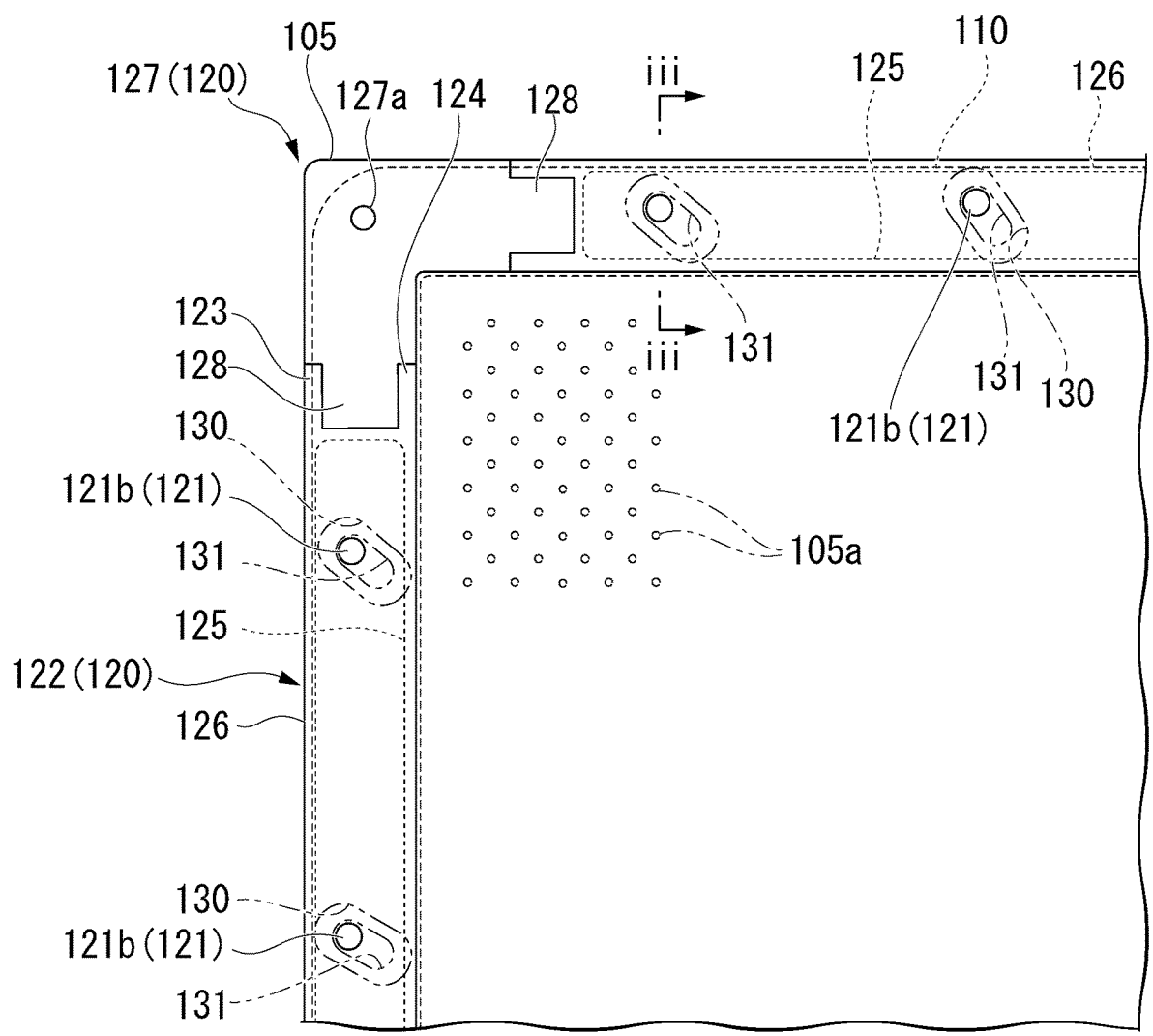
FIG. 5 is a top view showing a region including edge portions of the slide plate and the shower plate in the vacuum processing apparatus according to the first embodiment of the present invention.

FIG. 5 is a bottom view showing a region including a circumferential edge portion of the shower plate 105 in the present embodiment.

An entire region of the upper surface of the slide plate 120 is the sliding seal surface 120a.

As shown in FIGS. 2 to 5, the slide plate 120 has a configuration in which a plate body thereof parallel to an upper surface of the shower plate 105 is formed in a frame shape having substantially the same width.

As shown in FIGS. 4 and 5, the slide plate 120 includes side slide portions 122 positioned corresponding to four sides of the shower plate 105 having substantially a rectangular outline, and corner slide portions 127 positioned corresponding to four corners (corners) of the shower plate 105.

The side slide portions 122 and the corner slide portions 127 have the same thickness as shown in FIG. 5. The side slide portions 122 and the corner slide portions 127 are all attached to the upper surface of the shower plate 105.

Each of the corner slide portions 127 is combined with end portion sides of the side slide portions 122 extending along two adjacent sides of the shower plate 105.

The corner slide portion 127 is fixed to the upper surface of the shower plate 105 using a fastening screw 127a.

The side slide portion 122 is attached to the upper surface of the shower plate 105 by being sandwiched between the corner slide portion 127 fixed to the shower plate 105, and the shower plate 105 and the electrode frame 110. Also, the side slide portion 122 is restricted in position not to come off also by the stepped bolt 121 penetrating through a through hole 125a as will be described below.

The corner slide portion 127 includes two labyrinth protrusions 128 and 128 protruding respectively toward the side slide portions 122 combined therewith. The labyrinth protrusions 128 each protrude in a direction along the outline side of the shower plate 105.

The two labyrinth protrusions 128 of the corner slide portion 127 protrude in directions perpendicular to each other. Each of the labyrinth protrusions 128 is disposed at a center in a width direction of the corner slide portion 127. That is, each of the two labyrinth protrusions 128 is disposed at a central position in a width direction of the slide plate 120 facing thereto.

Each of the side slide portions 122 includes two labyrinth protrusions 123 and 124 protruding toward the corner slide portion 127 combined therewith. The labyrinth protrusion 123 and the labyrinth protrusion 124 protrude in a direction along the outline side of the shower plate 105. The labyrinth protrusion 123 and the labyrinth protrusion 124 are formed parallel to each other.

The labyrinth protrusion 123 and the labyrinth protrusion 124 are respectively disposed at both outer positions in the width direction of the slide plate 120 with respect to the labyrinth protrusion 128 of the corner slide portion 127. The labyrinth protrusions 123 and the labyrinth protrusions 124 are set to have the same length in the width direction of the slide plate 120 as each other.

In the width direction of the slide plate 120, the widths of the labyrinth protrusion 123 and the labyrinth protrusion 124 can each be set to be smaller than the width of the labyrinth protrusion 128.

The labyrinth protrusion 123 and the labyrinth protrusion 128 are in contact with each other. Also, the labyrinth protrusion 124 and the labyrinth protrusion 128 are in contact with each other.

An inner side surface of the labyrinth protrusion 123 is a sliding seal surface 123a, and an outer side surface of the labyrinth protrusion 128 is a sliding seal surface 128a. The sliding seal surface 123a and the sliding seal surface 128a are in contact with each other.

An outer side surface of the labyrinth protrusion 124 is a sliding seal surface 124b, and an inner side surface of the labyrinth protrusion 128 is a sliding seal surface 128b. The sliding seal surface 124b and the sliding seal surface 128b are in contact with each other.

Here, in the labyrinth protrusions 123, 124, and 128, "inner side" and "outer side" indicate positions in inward and outward directions with respect to the gas introduction space 101b, that is, positions in a radial direction from a center in a plane of the shower plate 105.

In the labyrinth protrusion 128 provided on one side of the corner slide portion 127, the sliding seal surface 128a and sliding seal surface 128b are formed parallel to each other.

Also, in the two protrusions of the labyrinth protrusion 123 and the labyrinth protrusion 124 provided at one end of the side slide portion 122, the sliding seal surface 123a and the sliding seal surface 124b facing each other are formed parallel to each other.

The sliding seal surface 128a, the sliding seal surface 128b, the sliding seal surface 123a, and the sliding seal surface 124b are all formed in a direction parallel to the outline side of the shower plate 105.

The sliding seal surface 128a, the sliding seal surface 128b, the sliding seal surface 123a, and the sliding seal surface 124b are all formed in a vertical direction.

Upper ends of the sliding seal surface 128a, the sliding seal surface 128b, the sliding seal surface 123a, and the sliding seal surface 124b are all in contact with the electrode frame 110. Lower ends of the sliding seal surface 128a, the sliding seal surface 128b, the sliding seal surface 123a, and the sliding seal surface 124b are all in contact with the shower plate 105.

As described above, the labyrinth protrusion 123 of the side slide portion 122, the labyrinth protrusion 128 of the corner slide portion 127, and the labyrinth protrusion 124 of the side slide portion 122 are aligned in an outline direction of the gas introduction space 101b.

That is, the labyrinth protrusion 123, the labyrinth protrusion 128, and the labyrinth protrusion 124 are alternately disposed in the outline direction of the gas introduction space 101b to be multiple stages from an inner side toward an outer side of the gas introduction space 101b.

Therefore, even when the side slide portion 122 and the corner slide portion 127 relatively move in a direction parallel to the outline side of the shower plate 105, the labyrinth protrusion 124 and the labyrinth protrusion 128 are maintained in a state of being in contact with each other.

Since the sliding seal surface 124b and the sliding seal surface 128b are not spaced apart from each other in this manner, sealing at this portion is maintained.

At the same time, even when the side slide portion 122 and the corner slide portion 127 relatively move in a direction parallel to the outline side of the shower plate 105, the labyrinth protrusion 128 and the labyrinth protrusion 123 are maintained in a state of being in contact with each other.

Since the sliding seal surface 128a and the sliding seal surface 123a are not spaced apart from each other in this manner, sealing at this portion is maintained.

Furthermore, the labyrinth protrusion 128 of the corner slide portion 127 slides while being sandwiched between the labyrinth protrusion 123 and the labyrinth protrusion 124 of the side slide portions 122 positioned on both sides thereof.

Therefore, the sliding seal surface 124b and the sliding seal surface 128b are not spaced apart from each other. At the same time, the sliding seal surface 128a and the sliding seal surface 123a are not spaced apart from each other.

In this way, the side slide portion 122 and the corner slide portion 127 are slidable via the sliding seal surfaces 123a to 128b in response to thermal deformation that occurs when a temperature of the shower plate 105 is raised or lowered while a sealed state is maintained.

Therefore, with such a configuration, a sealed state in a side wall portion of the gas introduction space 101b can be maintained at a height position of the slide plate 120 regardless of a temperature state.

As shown in FIGS. 3, 4, and 5, the slide plate 120 includes a recessed groove 125 formed at a portion in contact with the shower plate 105, that is, on a lower surface of the slide plate 120.

The recessed groove 125 is formed such that a leg portion 126 in contact with the shower plate 105 is positioned on the entire circumference of the side slide portion 122.

A depth of the recessed groove 125 can be freely set as long as the depth is smaller than a thickness of the slide plate 120 and is of a magnitude such that a strength of the slide plate 120 does not deteriorate.

A width of the leg portion 126, that is, a length in a width direction of the slide plate 120 is preferably as small as possible as long as it is of a magnitude such that a strength of the slide plate 120 does not deteriorate.

In the present embodiment, the recessed groove 125 is formed on the side slide portion 122. Furthermore, the recessed groove can be formed also on the corner slide portion 127.

In this case, as in the side slide portion 122, the recessed groove can be formed such that a leg portion in contact with the shower plate 105 is positioned on the entire circumference of the corner slide portion 127. Furthermore, in this case, the recessed groove can be formed also on the labyrinth protrusion 128 in the corner slide portion 127.

The through hole 125a is provided inside the recessed groove 125. The through hole 125a penetrates through the slide plate 120. A plurality of through holes 125a are provided in a direction in which the side slide portion 122 extends. The plurality of through holes 125a are disposed to be spaced apart from each other.

Furthermore, the slide plate 120 may have a configuration in which only the through holes 125a are formed and the recessed groove 125 is not provided.

The stepped bolt 121 penetrates through each of the through holes 125a. A diameter of the through hole 125a is set to be larger than a diameter of the stepped bolt 121. An outline shape of the through hole 125a corresponds to an elongated hole 131 to be described below.

Here, "shape of the through hole 125a corresponding to the elongated hole 131" indicates that, as will be described below, a shaft portion 121b of the stepped bolt 121 has a shape that is slidable without any trouble in response to thermal deformation that occurs when a temperature of the shower plate 105 is raised or lowered. That is, it indicates that the through hole 125a has a shape that does not affect relative movement of the stepped bolt 121 inside the elongated hole 131.

Specifically, the diameter of the through hole 125a is larger than a length of a major axis of the elongated hole 131. That is, when the through hole 125a is formed to be larger than the elongated hole 131 in a plan view, the through hole 125a does not come into contact with the shaft portion 121b of the stepped bolt 121 that relatively moves inside the elongated hole 131.

Also, an outline shape of the through hole 125a is not particularly limited as long as it has the above-described lengths.

Figure 6:
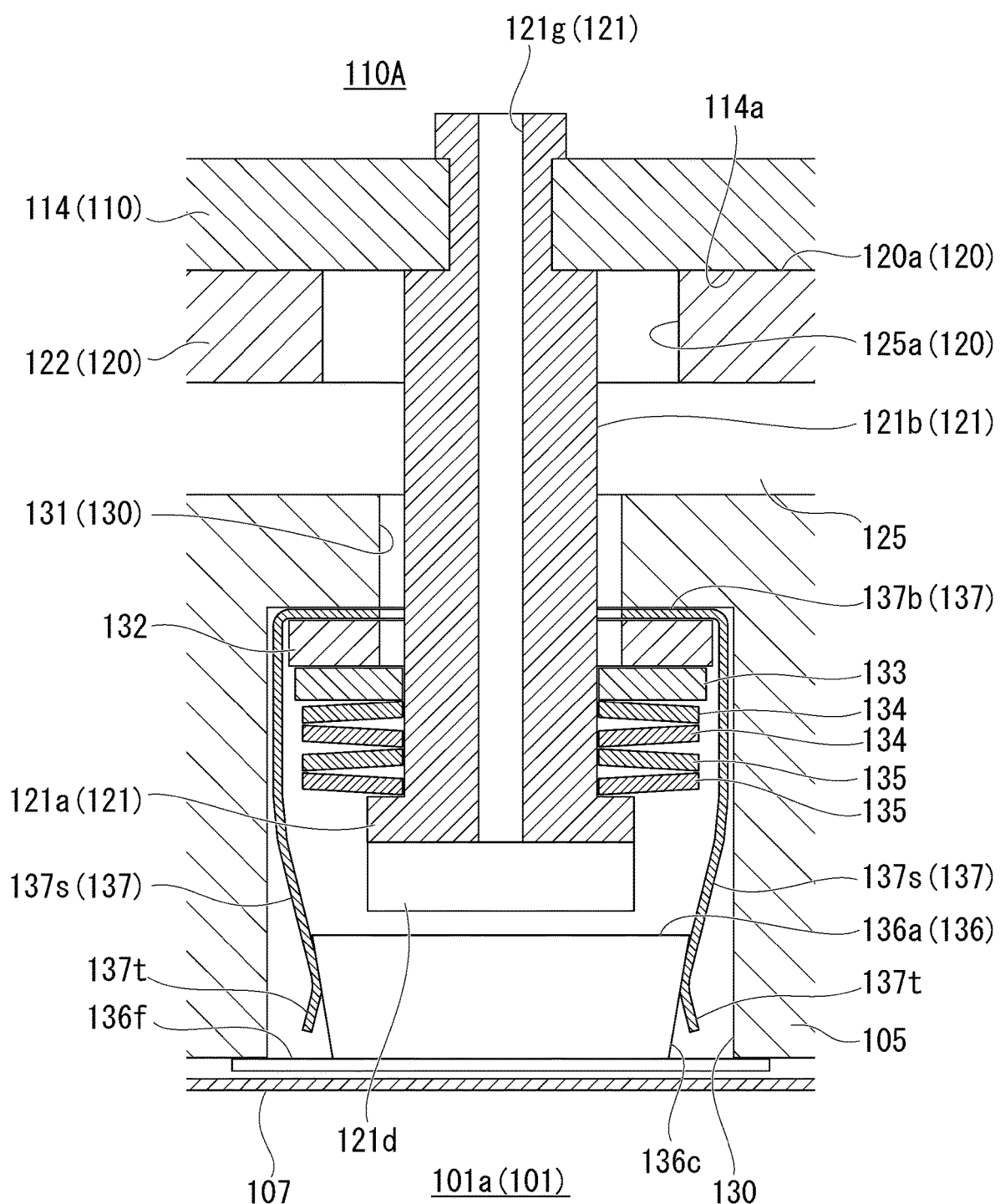
FIG. 6 is an enlarged cross-sectional view showing a region including a stepped bolt (support member) in the vacuum processing apparatus according to the first embodiment of the present invention.

FIG. 6 is a cross-sectional view showing a region including a suspending groove 130 and the elongated hole 131 of the shower plate 105 in the present embodiment and is an enlarged cross-sectional view along the arrow shown in FIG. 3. As shown in FIGS. 3, 5, and 6, a lower surface of the shower plate 105 includes the suspending groove 130 provided at the circumferential edge portion of the shower plate 105.

A plurality of suspending grooves 130 are provided in the circumferential edge portion of the shower plate 105 at predetermined intervals.

The elongated hole 131 penetrating through the shower plate 105 in a thickness direction is provided inside each of the suspending grooves 130.

The suspending groove 130 is formed as a similar shape to an enlarged elongated hole 131.

As shown in FIGS. 3, 5, and 6, the shaft portion 121b of the stepped bolt 121 penetrates through the elongated hole 131 and is fixed to the electrode frame 110.

The elongated hole 131 is formed to be longer in a direction of thermal deformation that occurs when a temperature of the shower plate is raised or lowered so that the shaft portion 121b of the stepped bolt 121 is slidable in response to the thermal deformation that occurs when a temperature of the shower plate 105 is raised or lowered.

That is, the elongated hole 131 has the major axis parallel to a straight line drawn radially from the fixed shaft 109 which is at a central position of the shower plate 105 in a plan view. Therefore, the elongated hole 131 is an ellipse (rounded rectangle) having a major axis with a different inclination direction depending on a disposition position thereof.

The elongated hole 131 has an opening size in a major axis direction set to be longer than a distance over which the shaft portion 121b of the stepped bolt 121 relatively moves in response to thermal deformation that occurs when a temperature of the shower plate 105 is raised or lowered. Therefore, a length of the elongated hole 131 in the major axis direction needs to be appropriately changed according to a length of the shower plate 105 and a coefficient of thermal expansion defined by a material thereof.

An opening size of the elongated hole 131 in a minor axis direction may be slightly larger than an outer diameter of the shaft portion 121b of the stepped bolt 121.

As shown in FIGS. 3, 5, and 6, a long slide member (long washer) 132 is disposed in an opening of the elongated hole 131 on the suspending groove 130 side. The shaft portion 121b of the stepped bolt (support member) 121 penetrates through the long slide member 132.

The long slide member 132 has an outline shape having a similar shape to the suspending groove 130 and has the same or slightly smaller lengths than those of the suspending groove 130. The long slide member 132 has an opening shape having a similar shape to the elongated hole 131 and has the same or slightly smaller lengths than those of the elongated hole 131.

A diameter of the opening of the long slide member 132 in the minor axis direction is set to be the same as or slightly smaller than a diameter of the opening of the elongated hole 131 in the minor axis direction. A diameter of the opening of the long slide member 132 in the major axis direction is set to be the same as or slightly smaller than a diameter of the opening of the elongated hole 131 in the major axis direction.

A bolt head 121a of the stepped bolt 121 is positioned below the long slide member 132. A slide member (washer) 133 and disc springs 134 and 135 are disposed to be stacked from above between the long slide member 132 and the bolt head 121a.

The shaft portion 121b of the stepped bolt 121 penetrates through the slide member 133 and the disc springs 134 and 135.

The diameter of the opening of the long slide member 132 in the minor axis direction is set to be smaller than an outer diameter of the bolt head 121a of the stepped bolt 121.

Also, the diameter of the opening of the long slide member 132 in the minor axis direction is set to be smaller than an outer diameter of the slide member 133.

The outer diameter of the slide member 133 is set to be the same as or slightly larger than the outer diameter of the bolt head 121a. Also, the outer diameter of the slide member 133 is set to be larger than the diameter of the opening of the long slide member 132 in the minor axis direction.

Inner diameters of the slide member 133 and the disc springs 134 and 135 are set to be the same as or slightly larger than the outer diameter of the shaft portion 121b of the stepped bolt 121.

The slide member 133 and the disc springs 134 and 135 follow sliding of the stepped bolt 121 which is slidable inside the suspending groove 130.

The long slide member 132 and the slide member 133 are slidably in contact with each other.

The stepped bolt 121 relatively moves in response to thermal deformation that occurs when a temperature of the shower plate 105 is raised or lowered. At this time, the shaft portion 121b slides in the major axis direction of the elongated hole 131 inside the suspending groove 130. According to the sliding movement, the slide member 133 also slides in the major axis direction of the elongated hole 131 inside the suspending groove 130.

At this time, the slide member 133 slides with the long slide member 132 positioned below a circumference of the elongated hole 131 inside the suspending groove 130.

At this time, a relationship between the size of the opening of the elongated hole 131 in the minor axis direction, the size of the opening of the long slide member 132 in the minor axis direction, the outer diameter of the slide member 133, and the outer diameter of the bolt head 121a, in order from the above, is set as described above.

Therefore, the long slide member 132 can be restricted such that it does not move from the opening of the elongated hole 131 to the recessed groove 125 side. The slide member 133 can be restricted such that it does not move from the opening of the long slide member 132 to the recessed groove 125 side. The bolt head 121a can be restricted such that it does not move in a vertical direction with respect to the slide member 133.

Therefore, a position of the bolt head 121a is restricted such that it does not move to the electrode frame 110 side by the long slide member 132 and the slide member 133.

That is, the bolt head 121a of the stepped bolt 121 can be restricted such that it does not come off to the recessed groove 125 side.

Therefore, the long slide member 132 and the slide member 133 restrict the position of the bolt head 121a to be constant in an axial direction of the stepped bolt 121.

That is, the long slide member 132 and the slide member 133 slide while a suspended state of the shower plate 105 due to the stepped bolt 121 is maintained. Therefore, a suspended height position of the shower plate 105 is maintained, and the stepped bolt 121 is slidable inside the suspending groove 130.

The long slide member 132 and the slide member 133 can be made of the same material as the slide plate 120. Specifically, the long slide member 132 and the slide member 133 can be made of a metal such as Hastelloy.

The disc springs 134 and 135 are attached to apply a force to the bolt head 121a of the stepped bolt 121 downward. As shown in FIG. 6, the disc springs 134 and 135 can each be formed in multiple sheets.

Similarly to the slide member 133, the disc springs 134 and 135 are movable according to the sliding of the shaft portion 121b of the stepped bolt 121 inside the suspending groove 130 in response to thermal deformation that occurs when a temperature of the shower plate 105 is raised or lowered. At this time, a state of applying a force to the bolt head 121a and the slide member 133 by the disc springs 134 and 135 is maintained.

Furthermore, a plurality of disc springs 134 and 135 may be provided, and the number thereof is not limited. The slide member 133 and the disc springs 134 and 135 can be made of a material having elasticity such as, for example, Inconel.

In FIG. 5, illustrations of the long slide member 132, the slide member 133, the disc springs 134 and 135, and a lid (cap) 136 are omitted. Also, in FIG. 5, main portions such as the slide plate 120 and the electrode frame 110 are shown by broken lines.

The lid 136 is provided at a position at a lower side opening of the suspending groove 130 as shown in FIGS. 3 and 6. The lid 136 closes the opening on the lower side of the suspending groove 130. That is, the lid 136 closes the opening of the elongated hole 131.

The lid 136 includes an insertion portion 136a inserted into a side inward from the opening of the suspending groove 130, a flange 136f provided around the insertion portion 136a, and a force-applying portion 137 that applies a force to the lid 136 so that the lid 136 does not come off from the suspending groove 130.

A planar outline shape of the insertion portion 136a has a similar shape to the opening of the suspending groove 130. The insertion portion 136a has an outline shape that is one size smaller than the opening of the suspending groove 130. The insertion portion 136a has a configuration in which a plate body that closes the opening of the suspending groove 130 and a plate shape along an inner wall of the suspending groove 130 are connected.

On an outer circumference of the insertion portion 136a facing the inner wall of the suspending groove 130, an inclined surface 136c inclined toward the inner wall of the suspending groove 130 along a direction away from the flange 136f is formed. The insertion portion 136a expands in diameter in a direction away from the flange 136f due to the inclined surface 136c.

Furthermore, the insertion portion 136a can be a bulk-shaped member that closes the opening of the suspending groove 130.

The flange 136f is in contact with a lower surface of the shower plate 105 around the opening of the suspending groove 130. An outline shape of the flange 136f has a similar shape to the opening of the suspending groove 130. The flange 136f has an outline shape that is one size larger than the opening of the suspending groove 130.

The lid 136 is attached so that the flange 136f is in contact with the lower surface of the shower plate 105 over the entire circumference of the opening of the suspending groove 130.

The insertion portion 136a and the flange 136f are formed such that a surface of the lid 136 is a plane parallel to the lower surface of the shower plate 105 when the lid 136 is attached to close the suspending groove 130.

The force-applying portion 137 is an elastic member that applies a force to and fastens the insertion portion 136a when the lid 136 is attached to close the suspending groove 130.

The force-applying portion 137 may be, for example, a leaf spring.

The force-applying portion 137 has an innermost portion of the suspending groove 130, that is, a base portion 137b positioned on the elongated hole 131 side of the long slide member 132.

The base portion 137b is sandwiched between the innermost portion of the suspending groove 130 and the long slide member 132 to be fixed inside the suspending groove 130. Furthermore, the base portion 137b has an opening having a size corresponding to the elongated hole 131 or has a planar outline shape that does not close the elongated hole 131.

Two sheets of elastic portions 137s bent from both end sides of the base portion 137b and extending along the inner wall of the suspending groove 130 are connected to the base portion 137b.

The elastic portions 137s are disposed such that plate surfaces of the elastic portions 137s are substantially parallel to the major axis direction of the elongated hole 131. The elastic portions 137s are provided one by one at positions on both sides of the elongated hole 131 in the minor axis direction.

The two sheets of elastic portions 137s are both inclined to a center side of the suspending groove 130 from the base portion 137b side toward the opening side of the suspending groove 130.

Distal ends 137t of the elastic portions 137s on the opening side of the suspending groove 130 are inclined to approach opposite sides, that is, side walls of the suspending groove 130.

That is, the two sheets of the elastic portions 137s gradually decrease in distance in a direction in which the two sheets of the elastic portions 137s face each other from the base portion 137b side toward the distal ends 137t and then are separated on the distal end 137t sides.

The two sheets of the elastic portions 137s come into contact with the inserted insertion portion 136a and, first, press it such that a distance between the two distal ends 137t facing each other is increased when the lid 136 is attached to close the suspending groove 130.

Next, as the insertion portion 136a enters in a depth direction of the suspending groove 130, the distance between the two distal ends 137t that has been once expanded decreases gradually along the inclined surface 136c of the insertion portion 136a due to elasticity of the elastic portion 137s.

When the two distal ends 137t whose distance therebetween has been expanded come into contact with the inclined surface 136c, the elastic portions 137s applies a force to the inclined surface 136c of the insertion portion 136a to sandwich it.

The insertion of the insertion portion 136a in the depth direction of the suspending groove 130 ends when the flange 136f comes into contact with the lower surface of the shower plate 105 over the entire circumference of the opening of the suspending groove 130. Therefore, the opening of the suspending groove 130 is closed by the lid 136.

In this state, a gas entering the inside of the suspending groove 130 from the film deposition space 101a side is hindered by the lid 136.

At this time, the two distal ends 137t of the force-applying portion 137 are in contact with the inclined surface 136c of the insertion portion 136a. Both the two distal ends 137t apply a force in a direction to sandwich the inclined surface 136c of the insertion portion 136a.

In this state, since the inclined surface 136c is formed to be inclined on the outer circumference of the insertion portion 136a, in order to pull off the insertion portion 136a, the two elastic portions 137s need to be expanded against the applied force. Therefore, the attached lid 136 is prevented from falling off.

As described above, the two sheets of the elastic portions 137s sandwich the inclined surface 136c of the insertion portion 136a, and therefore the lid 136 can be attached not to come off from the suspending groove 130.

Therefore, a gas from the film deposition space 101a side can be prevented from entering the inside of the suspending groove 130.

As shown in FIGS. 3 and 6, a distal end of the shaft portion 121b of the stepped bolt 121 is screwed to the lower plate surface portion (base portion) 114 from below. The stepped bolt 121 penetrates through the lower plate surface portion (base portion) 114. Therefore, the shaft portion 121b of the stepped bolt 121 protrudes into the U-shaped internal space 110A of the electrode frame 110 formed by the upper plate surface portion (fixed portion) 112, the vertical plate surface portion (wall portion) 113, and the lower plate surface portion (base portion) 114. The internal space 110A of the electrode frame 110 communicates with the gas introduction space 101b near the lower end of the reflector 117.

A lower end of the bolt head 121a of the stepped bolt 121 is positioned inside the suspending groove 130. A recess 121d for turning the stepped bolt 121 with a tool is provided on the bolt head 121a A gas hole 121g is formed in the shaft portion 121b and the bolt head 121a of the stepped bolt 121 in the axial direction of the stepped bolt 121. The gas hole 121g penetrates from the distal end of the shaft portion 121b to the lower end of the bolt head 121a. The gas hole 121g is formed coaxially with a central axis of the shaft portion 121b.

The gas hole 121g opens to a bottom surface of the recess 121d in the bolt head 121a.

The stepped bolt 121 penetrates through the lower plate surface portion (base portion) 114 of the electrode frame 110, the through hole 125a and the recessed groove 125 of the slide plate 120, and the elongated hole 131 of the shower plate 105.

Therefore, the gas hole 121g communicates with the internal space 110A in the vertical direction between the sliding seal surface 114a of the lower plate surface portion (base portion) 114 and the sliding seal surface 120a of the slide plate 120.

Even when the shaft portion 121b of the stepped bolt 121 slides inside the elongated hole 131 in response to thermal deformation that occurs when a temperature of the shower plate 105 is raised or lowered, the lower end of the bolt head 121a is positioned inside the suspending groove 130. At the same time, the distal end of the shaft portion 121b also protrudes into the U-shaped internal space 110A of the electrode frame 110.

Therefore, even when the electrode frame 110 and the slide plate 120 slide and move in position, the state of communicating between the U-shaped internal space 110A and the inside of the suspending groove 130 can be maintained.

Therefore, the inside of the suspending groove 130 can be maintained in a state of communicating with the gas introduction space 101b that communicates with the internal space 110A.

Furthermore, the inside of the elongated hole 131 communicating with the inside of the suspending groove 130 communicates with the gas introduction space 101b. The inside of the recessed groove 125 communicating with the elongated hole 131 communicates with the gas introduction space 101b. The inside of the through hole 125a communicating with the recessed groove 125 communicates with the gas introduction space 101b.

At the same time, the suspending groove 130, the elongated hole 131, the recessed groove 125, and the through hole 125a can all be maintained in a state of communicating with the gas introduction space 101b.

Also, even the vicinity of the sliding seal surface 114a exposed at the opening of the through hole 125a is maintained in a state of communicating with the gas introduction space 101b.

In the present embodiment, when the gas hole 121g is provided in the stepped bolt 121, a gas can be supplied to the inside of the suspending groove 130 communicating therewith from the gas introduction space 101b.

At the same time, the gas from the gas introduction space 101b can also be supplied to the inside of the elongated hole 131, the inside of the recessed groove 125, the inside of the through hole 125a, and the vicinity of the sliding seal surface 114a exposed at the opening of the through hole 125a.

In the vacuum processing apparatus 100 of the present embodiment, cleaning processing of the film deposition space 101a is performed at the end of film deposition processing. During cleaning, components that may be exposed to a cleaning gas are subjected to a corrosion resistance surface treatment.

As the components to be subjected to the corrosion resistance surface treatment, components made of Hastelloy, Inconel, aluminum, or the like can be exemplified. For example, the shower plate 105, the lid 136, the electrode frame 110, and the slide plate 120 may correspond thereto.

Furthermore, as the components inside the suspending groove 130 to be subjected to the corrosion resistance surface treatment, the stepped bolt 121, the long slide member 132, the slide member 133, and the disc springs 134 and 135 can be exemplified.

The corrosion resistance surface treatment can be applied to the entire surface of these components or only to a region having a possibility of being exposed to the cleaning gas.

Here, as will be described below, when the cleaning gas is $NF_3$ (nitrogen trifluoride) and cleaning the inside of the processing chamber is performed by generated F radicals, the corrosion resistance surface treatment is a treatment of forming a $Y_2O_3$ thin film.

The $Y_2O_3$ thin film deposition, that is, yttria coating is performed by CVD processing. As a condition of the yttria coating, a thickness of the $Y_2O_3$ film can be set to approximately 50 to 1000 nm, and preferably approximately 100 nm.

Furthermore, the components to which the yttria coating is applied are subjected to electrolytic polishing or an aluminum surface diffusion treatment prior to the yttria coating to further improve the corrosion resistance.

Here, object components to which the yttria coating is applied are components made of nickel alloy such as Inconel, Hastelloy, or the like.

Therefore, corrosion resistance in portions exposed to the cleaning gas can be improved and thus generation of particles can be prevented.

Particularly, improvement in corrosion resistance due to the yttria coating is very high in sliding components such as the slide plate 120 and the electrode frame 110 and components with a large amount of exposure to the cleaning gas such as the stepped bolt 121.

Therefore, a very high suppression effect with respect to generation of particles due to corrosion caused by the cleaning gas can be achieved by the yttria coating.

Figure 7:
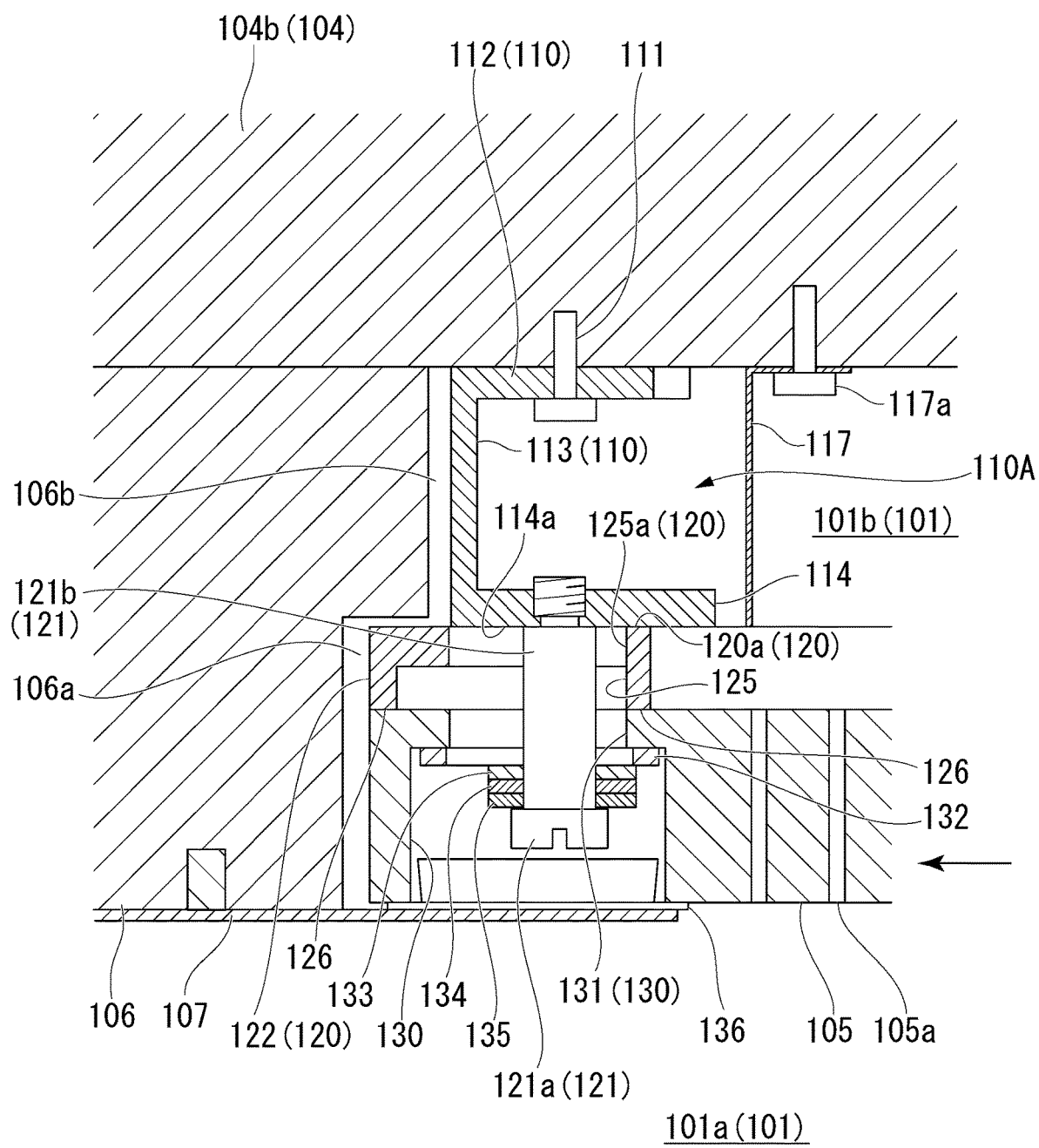
FIG. 7 is a cross-sectional view showing a thermally expanded state of the electrode frame, the slide plate, and an edge portion of the shower plate in the vacuum processing apparatus according to the first embodiment of the present invention.

FIG. 7 is an enlarged cross-sectional view showing the vicinity of an edge portion of the shower plate 105 in a thermally expanded state of the present embodiment.

When a plasma is generated using the vacuum processing apparatus 100 to be described below, the shower plate 105 is heated and thermally expanded (thermally deformed). At the time of the thermal expansion, as shown by an arrow in FIG. 7, the shower plate 105 expands outward in an in-plane direction with the fixed shaft 109 as a center.

The circumferential edge portion of the thermally expanded shower plate 105 expands in the thermal expansion absorption space 106a and thus does not come into contact with the insulating shield 106. Therefore, expansion of the shower plate 105 is absorbed such that stress is not applied to the electrode flange 104, the electrode frame 110, the insulating shield 106, or the like.

At this time, the movable shafts 108 can support the deformed shower plate 105 due to the spherical bushes at the lower ends.

Furthermore, the slide plate 120 fixed to the circumferential edge portion of the thermally expanded shower plate 105 integrally moves outward of the outer circumference of the shower plate 105. At this time, the circumferential edge portion of the shower plate 105 and the slide plate 120 also move to narrow the thermal expansion absorption space 106a as shown in FIG. 7.

Since the slide plate 120 does not come into contact with the insulating shield 106, movement of the slide plate 120 is absorbed such that stress is not applied to the electrode flange 104, the electrode frame 110, the insulating shield 106, or the like.

Also, the slide plate 120 moves integrally with the edge portion of the thermally deformed shower plate 105. In contrast, since the electrode frame 110 is fixed to the electrode flange 104, a relative position thereof with respect to the electrode flange 104 and the insulating shield 106 does not change that much.

Therefore, the sliding seal surface 114a of the electrode frame 110 and the sliding seal surface 120a of the slide plate 120 slide with each other while the electrode frame 110 is not deformed, and thus the shower plate 105 is in a thermally expanded state while a sealed state is maintained.

At this time, the stepped bolt 121 is fixed to the electrode frame 110. Therefore, a relative position of the stepped bolt 121 with respect to the electrode flange 104 and the insulating shield 106 does not change that much.

Also, the elongated hole 131 and the suspending groove 130 also move outward of the outer circumference of the shower plate 105 in the circumferential edge portion of the shower plate 105.

Therefore, the stepped bolt 121 relatively moves in the major axis direction of the elongated hole 131.

In the present embodiment, the major axis direction of the elongated hole 131 coincides with the direction of thermal deformation that occurs when a temperature of the shower plate 105 is raised or lowered. Therefore, the shaft portion 121b of the stepped bolt 121 is slidable inside the elongated hole 131 in response to thermal deformation that occurs when a temperature of the shower plate 105 is raised or lowered.

Accordingly, movement of the stepped bolt 121 is absorbed such that stress is not applied to the shower plate 105 and the stepped bolt 121 which are positioned close to the elongated hole 131.

Also, the through hole 125a of the slide plate 120 also moves outward of the outer circumference of the shower plate 105 with respect to the stepped bolt 121.

Therefore, the stepped bolt 121 moves relative to the through hole 125a.

Since the through hole 125a has a shape corresponding to the elongated hole 131, the shaft portion 121b of the stepped bolt 121 is slidable inside the through hole 125a in response to thermal deformation that occurs when a temperature of the shower plate 105 is raised or lowered. Therefore, movement of the stepped bolt 121 is absorbed such that stress is not applied to the slide plate 120 and the stepped bolt 121 which are positioned close to the through hole 125a.

Therefore, suspending support of the shower plate 105 with respect to the electrode frame 110 using the stepped bolt 121 is maintained.

At the same time, the state of communicating between the U-shaped internal space 110A and the inside of the suspending groove 130 can be maintained by the gas hole 121g of the stepped bolt 121.

Furthermore, since the opening of the suspending groove 130 is closed by the lid 136, a gas is prevented from flowing into the suspending groove 130.

In the present embodiment, the sliding seal surface 114a of the lower plate surface portion (base portion) 114 of the electrode frame 110 and the sliding seal surface 120a of the slide plate 120 slide with each other in a thermal expansion direction of the shower plate 105. Therefore, even during the thermal expansion, a contact state therebetween is maintained without being deformed, and therefore a sealed state and a state of supporting a load of the shower plate 105 can be maintained.

Also, since the electrode frame 110 and the slide plate 120 are made of the same material of Hastelloy, generation of particles due to scratching between the members can be suppressed.

Therefore, deterioration of film thickness characteristics in the vacuum processing apparatus 100 can be prevented.

Furthermore, in the present embodiment, the corner slide portion 127 that slidably seals end portions of the side slide portions 122 of the slide plate 120 is provided at positions of corner portions (corner portions) of the upper surface of the shower plate 105 having a rectangular outline shape.

In the circumferential edge portion of the thermal expanded shower plate 105, the side slide portion 122 and the corner slide portion 127 which are fixed to the circumferential edge portion of the shower plate 105 are spaced apart in a linear direction along the outline side of the shower plate 105.

Therefore, the labyrinth protrusion 123 and the labyrinth protrusion 124 of the side slide portion 122 and the labyrinth protrusion 128 of the corner slide portion 127 are spaced apart from each other.

At this time, the sliding seal surface 123a and the sliding seal surface 128a slide with each other in a direction along a straight line of the outline side of the shower plate 105. Also, the sliding seal surface 124b and the sliding seal surface 128b slide with each other in a direction along a straight line of the outline side of the shower plate 105.

Therefore, the side slide portion 122 and the corner slide portion 127 can be spaced apart from each other while the sealed state is maintained.

Gas leakage in the shower plate 105 can be prevented by the side slide portion 122 and the corner slide portion 127 having the labyrinth structure as described above, and therefore a sealed state of the gas introduction space 101b can be maintained.

Next, a method of cleaning the vacuum processing apparatus 100 will be described with reference to the drawings.

Figure 8:
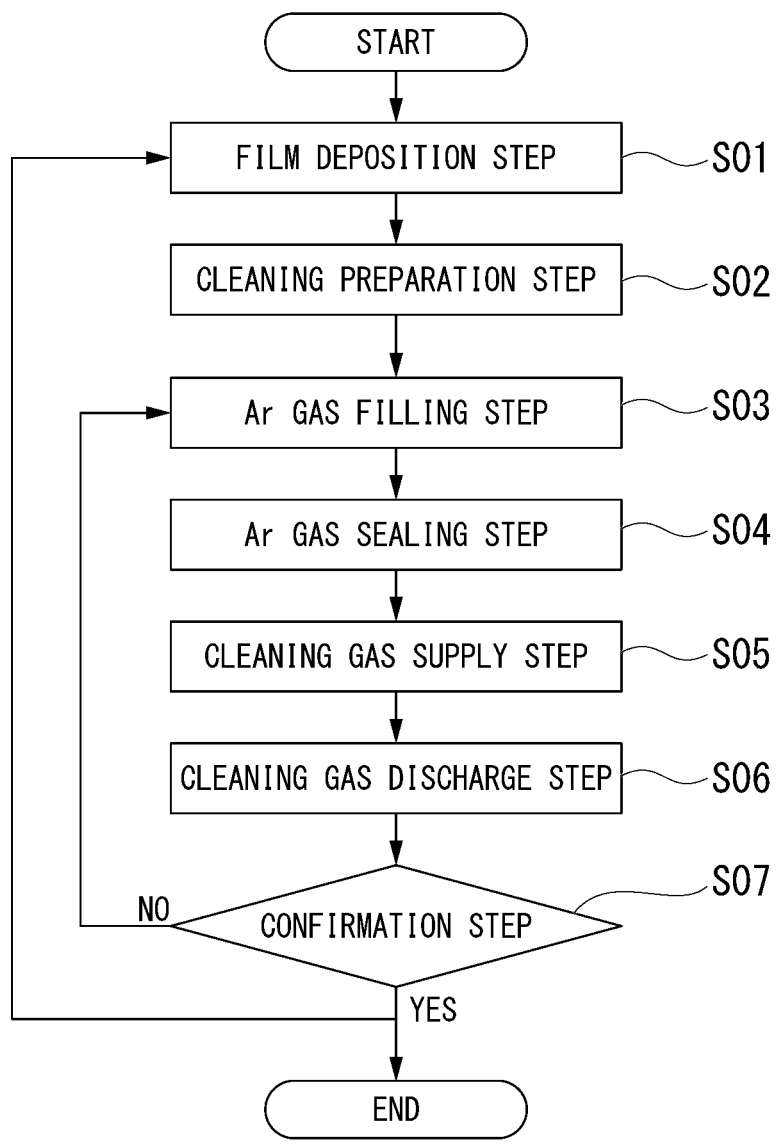
FIG. 8 is a flowchart showing a method of cleaning the vacuum processing apparatus according to the first embodiment of the present invention.

FIG. 8 is a flowchart showing a method of cleaning the vacuum processing apparatus according to the present embodiment.

As shown in FIG. 8, the method of cleaning the vacuum processing apparatus according to the present embodiment includes a film deposition step S01, a cleaning preparation step S02, an Ar gas filling step (purge step) S03, and an Ar gas sealing step (purge gas sealing step) S04. Also, the method of cleaning the vacuum processing apparatus according to the present embodiment includes a cleaning gas supply step (cleaning step) S05, a cleaning gas discharge step S06, and a confirmation step S07.

In the film deposition step S01 shown in FIG. 8, a film is formed on a processing surface of the substrate S using the vacuum processing apparatus 100.

First, the inside of the vacuum chamber 102 is depressurized using the vacuum pump 148. In a state in which the inside of the vacuum chamber 102 is maintained at a vacuum, the substrate S is loaded from the outside of the vacuum chamber 102 toward the film deposition space 101a. The substrate S is placed on the support portion (heater) 141.

The support column 145 is pushed upward, and the substrate S placed on the support portion (heater) 141 also is moved upward. Therefore, a distance between the shower plate 105 and the substrate S is determined as desired to be a distance needed for performing appropriate film deposition, and then the distance is maintained.

Thereafter, a process gas is introduced from the gas supply unit 142 into the gas introduction space 101b through a gas introduction pipe and a gas introduction port. Then, the process gas is ejected from the gas ejection ports 105a of the shower plate 105 into the film deposition space 101a.

Next, the RF power supply 147 is activated to apply high-frequency power to the electrode flange 104.

Then, a high-frequency current flows from a surface of the electrode flange 104 along the surface of the shower plate 105, and electrical discharge is generated between the shower plate 105 and the support portion (heater) 141.

Then, a plasma is generated between the shower plate 105 and the processing surface of the substrate S.

The process gas is decomposed in the plasma generated as described above so that a process gas in a plasma state can be obtained, vapor phase epitaxy reactions occur on the processing surface of the substrate S, and therefore a thin film is deposited on the processing surface.

During the processing of the vacuum processing apparatus 100, the shower plate 105 thermally expands (thermally deformed).

At this time, a sealed state is maintained by the electrode frame 110 and the slide plate 120.

Therefore, an amount of gas that leaks from the gas introduction space 101b to the film deposition space 101a through a portion other than the gas ejection port 105a is reduced.

Also, at the end of the processing of the vacuum processing apparatus 100, the shower plate 105 is thermally contracted (thermally deformed). At this time, the sealed state is maintained by the electrode frame 110 and the slide plate 120, and therefore an amount of gas that leaks from the gas introduction space 101b to the film deposition space 101a through a portion other than the gas ejection port 105a is reduced.

Also, since there is no component that is forced to be deformed by the thermal deformation of the shower plate 105, service lives of components can be prolonged.

In the cleaning preparation step S02 shown in FIG. 8, preparation for cleaning is set after the film deposition step S01 ends. Here, "end of the film deposition step S01" indicates a case in which the film deposition has been performed a predetermined number of times, or a case in which a certain amount or more of deposits have adhered to the components exposed to the film deposition space 101a such as the shower plate 105 or the other components that have otherwise been in contact with the process gas.

Also, the cumulative number of times of film deposition and a cumulative amount of time of film deposition are set in advance as a timing for implementing the cleaning so that particles that affect film deposition characteristics are not generated.

In the cleaning preparation step S02, the inside of the vacuum chamber 102 is evacuated using the vacuum pump 148. Therefore, the process gas is removed from the film deposition space 101a.

In the Ar gas filling step (purge step) S03 shown in FIG. 8, the gas introduction space 101b is filled with Ar gas as a purge gas prior to the cleaning Here, the purge gas is not limited to Ar gas as long as it has low reactivity.

Ar gas is introduced from the gas supply unit 142 into the gas introduction space 101b through the gas introduction pipe and the gas introduction port.

At the same time, the inside of the vacuum chamber 102 may be evacuated using the vacuum pump 148.

Next, as the Ar gas sealing step (purge gas sealing step) S04 shown in FIG. 8, the inside of the suspending groove 130 is filled with Ar gas to prevent entering of the cleaning gas.

At this time, the inside of the suspending groove 130 is filled with the Ar gas introduced into the gas introduction space 101b in the Ar gas filling step (purge step) S03.

At the same time, the inside of the vacuum chamber 102 may be evacuated using the vacuum pump 148.

The inside of the suspending groove 130 is filled with the Ar gas from the gas introduction space 101b through the U-shaped internal space 110A of the electrode frame 110 and the gas hole 121g of the stepped bolt 121.

Furthermore, in the Ar gas sealing step (purge gas sealing step) S04, the insides of the elongated hole 131, the recessed groove 125, and the through hole 125a are filled with the Ar gas introduced to the inside of the suspending groove 130.

In the Ar gas filling step (purge step) S03 and the Ar gas sealing step (purge gas sealing step) S04, inner surfaces of the gas introduction space 101b, the suspending groove 130, the elongated hole 131, the recessed groove 125, and the through hole 125a, and the vicinity of the sliding seal surface 114a exposed at the opening of the through hole 125a are sealed with Ar gas and maintained as an Ar gas atmosphere.

In this state, in the cleaning gas supply step (cleaning step) S05 shown in FIG. 8, a cleaning gas is introduced into the film deposition space 101a through the cleaning gas supply unit 149. At the same time, the inside of the vacuum chamber 102 is evacuated using the vacuum pump 148.

Here, a gas amount (flow velocity/flow rate) of the cleaning gas introduced into the film deposition space 101a is set to be smaller than that of the Ar gas supplied to the gas introduction space 101b.

At the same time, the inside of the vacuum chamber 102 may be evacuated using the vacuum pump 148.

$NF_3$ (nitrogen trifluoride) can be used for the cleaning gas, and cleaning of the inside of the vacuum chamber 102 with F radicals generated by the cleaning gas supply unit 149 is performed.

Alternatively, $CF_4$ or $F_2$ can also be used for the cleaning gas.

Here, the cleaning gas supplied from the cleaning gas supply unit 149 is ejected from the opening of the supply pipe disposed close to the edge portion of the shower plate 105.

Therefore, cleaning for removing deposits in the film deposition space 101a is performed.

When the cleaning gas is ejected to the vicinity of the edge portion of the shower plate 105, cleaning the vicinity of the edge portion of the shower plate 105 having a large amount of deposits can be sufficiently performed.

On the other hand, a degree of exposure to the cleaning gas increases in the vicinity of the edge portion of the shower plate 105. That is, the vicinity of the edge portion of the shower plate 105 is exposed to a high-concentration cleaning gas and an exposure time thereof to the cleaning gas increases.

Therefore, a degree of corrosion occurrence due to the cleaning gas also increases in the vicinity of the edge portion of the shower plate 105.

However, in the vacuum processing apparatus 100 according to the present embodiment, since yttria coating is applied to portions exposed to the cleaning gas, corrosion resistance of the portions improves.

Also, since the lower side opening of the suspending groove 130 is closed by the lid 136, the cleaning gas does not enter the suspending groove 130.

Furthermore, since the suspending groove 130 is filled with Ar gas in the Ar gas sealing step (purge gas sealing step) S04, the cleaning gas does not enter the suspending groove 130.

Therefore, also in the cleaning gas supply step (cleaning step) S05, inner surfaces of the suspending groove 130, the elongated hole 131, the recessed groove 125, and the through hole 125a, and the vicinity of the sliding seal surface 114a exposed at the opening of the through hole 125a are not exposed to the cleaning gas.

Also, the stepped bolt 121, the long slide member 132, the slide member 133, and the disc springs 134 and 135 inside the suspending groove 130 also are not exposed to the cleaning gas.

Therefore, occurrence of corrosion on these surfaces due to the cleaning gas can be prevented. Furthermore, generation of particles on these surfaces due to corrosion caused by the cleaning gas can be prevented.

Furthermore, the effect of preventing generation of particles can be achieved not only during the cleaning but also after the cleaning has ended.

After a required processing time has elapsed, the supply of the cleaning gas from the cleaning gas supply unit 149 to the film deposition space 101a is stopped.

In the cleaning gas discharge step S06 shown in FIG. 8, the inside of the vacuum chamber 102 is evacuated using the vacuum pump 148.

At this time, Ar gas may be continuously supplied to the gas introduction space 101b.

In the confirmation step S07 shown in FIG. 8, it is confirmed whether removal of the deposits has sufficiently been performed in the vacuum chamber 102.

When the removal of the deposits is completed, a new film deposition is performed as the film deposition step S01, or the processing proceeds to another step such as stopping the operation of the apparatus.

When the removal of the deposits is not completed, the flow returns to the Ar gas filling step (purge step) S03, and the cleaning is performed again.

Therefore, the cleaning processing ends.

In the method of cleaning the vacuum processing apparatus according to the present embodiment, the suspending groove 130 has the opening that is closed in advance by the lid 136 and is sealed with Ar gas in the Ar gas filling step (purge step) S03 and the Ar gas sealing step (purge gas sealing step) S04. Therefore, occurrence of corrosion due to the cleaning gas can be prevented. Furthermore, generation of particles due to corrosion caused by the cleaning gas can be prevented.

Furthermore, in the present embodiment, the stepped bolt 121 is configured to penetrate from the distal end of the shaft portion 121b to the lower end of the bolt head 121a and have the gas hole 121g that is coaxial with the central axis of the shaft portion 121b, but a gas hole having a shape other than that can also be used.

Figure 9:
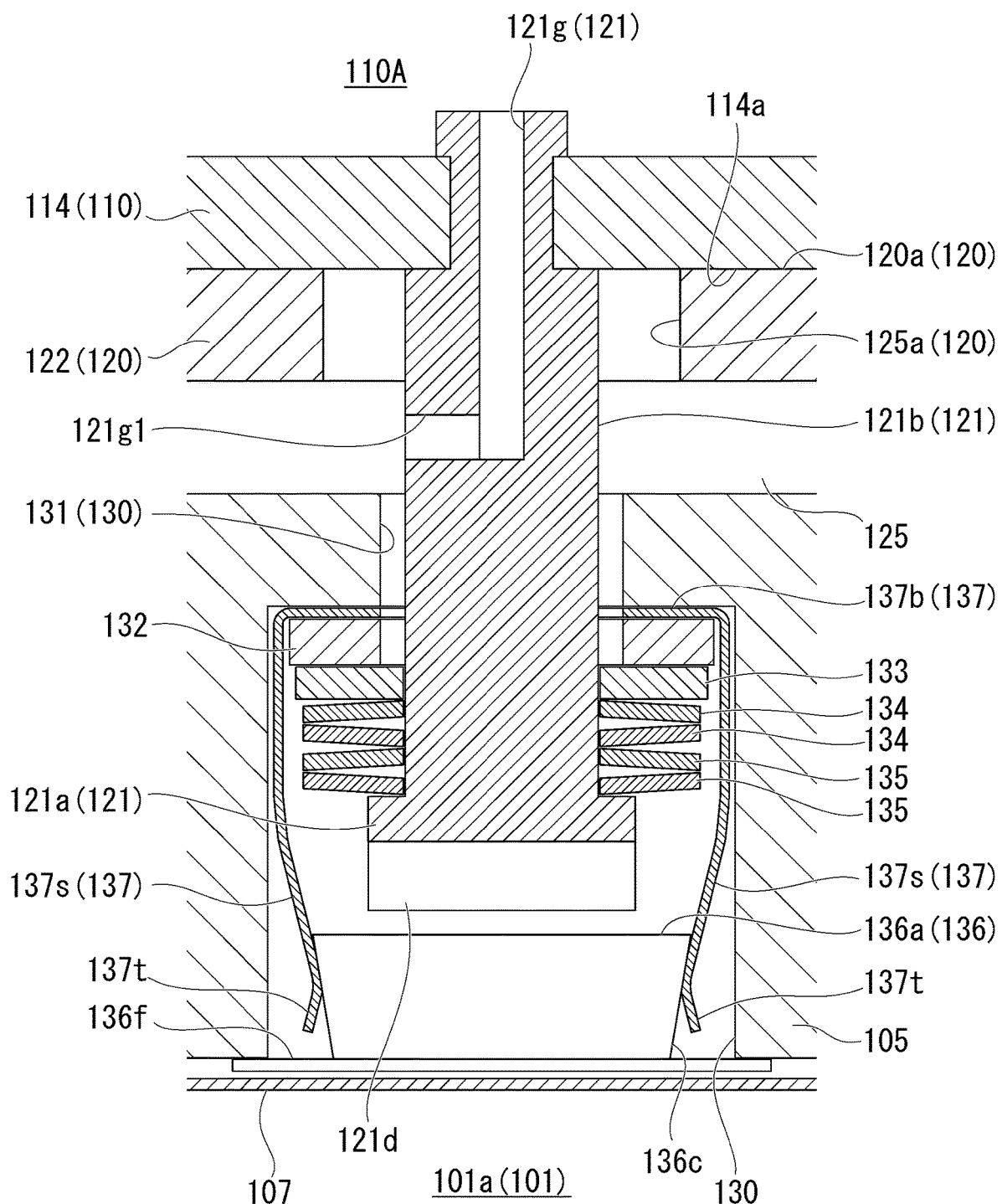
FIG. 9 is an enlarged cross-sectional view showing another example of a region including a stepped bolt (support member) in the vacuum processing apparatus according to the first embodiment of the present invention.

For example, as shown in FIG. 9, the stepped bolt 121 can be configured to have a gas hole 121g1 that allows the distal end of the shaft portion 121b to communicate with the recessed groove 125 of the slide plate 120.

Even with the configuration having the gas hole 121g1 with the shape, a gas can be supplied from the gas introduction space 101b to the inside of the suspending groove 130 communicating with each other.

Hereinafter, a vacuum processing apparatus and a method of cleaning the vacuum processing apparatus according to a second embodiment of the present invention will be described with reference to the drawings.

Figure 10:
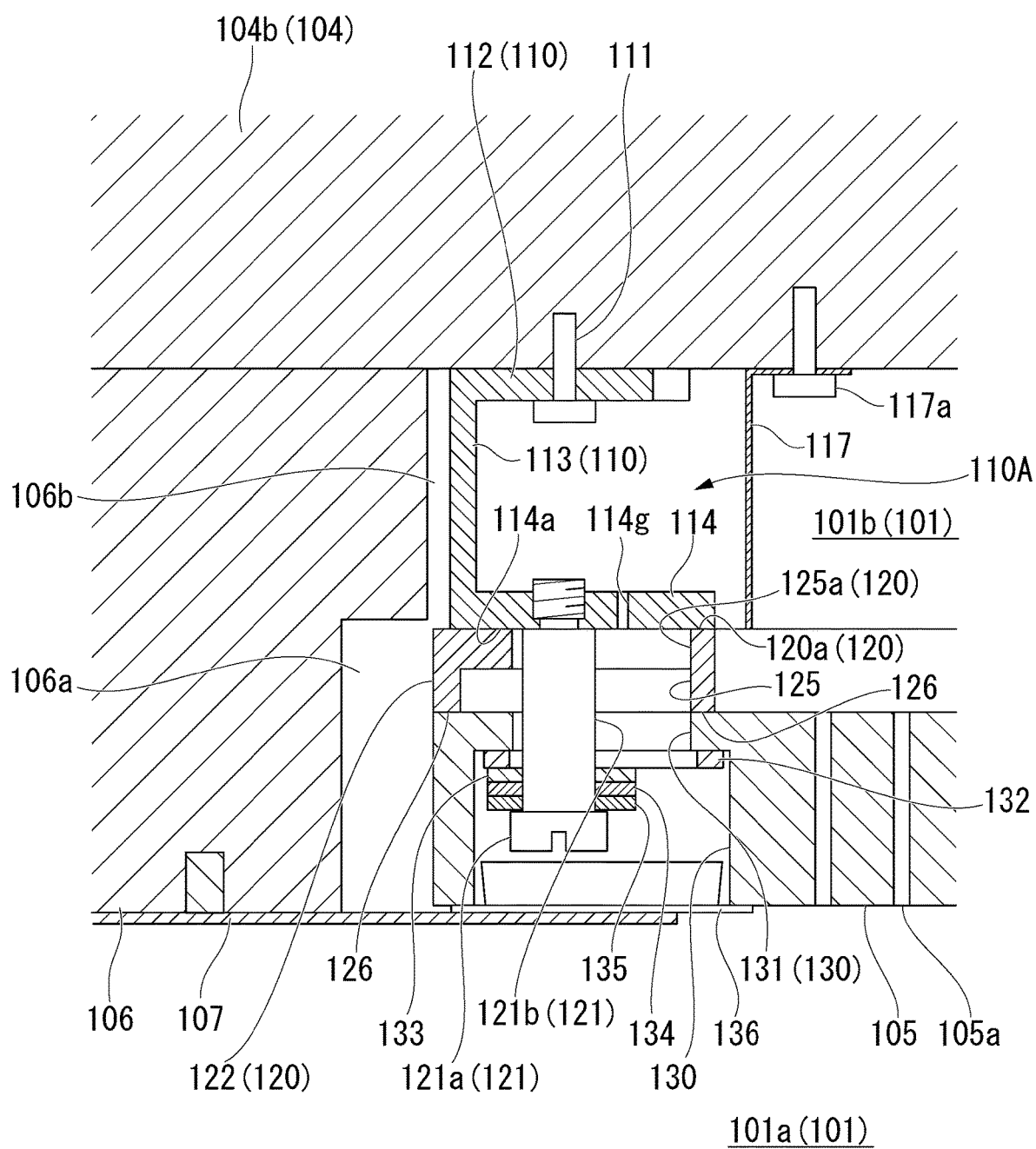
FIG. 10 is a cross-sectional view showing an electrode frame, a slide plate, and an edge portion of the shower plate in a vacuum processing apparatus according to a second embodiment of the present invention.

FIG. 10 is an enlarged cross-sectional view showing a region including an edge portion of a shower plate 105 according to the present embodiment.

The present embodiment is different from the above-described first embodiment in terms of a position in which a gas hole is formed, and the other constituents corresponding to those in the above-described first embodiment will be denoted by the same reference numerals and description thereof will be omitted.

In the present embodiment, a gas hole 114g is formed in the lower plate surface portion (base portion) 114 as shown in FIG. 10.

The gas hole 114g vertically penetrates through the lower plate surface portion (base portion) 114.

The gas hole 114g opens to the U-shaped internal space 110A of the electrode frame 110 in the lower plate surface portion (base portion) 114. Also, the gas hole 114g opens to the sliding seal surface 114a exposed to the through hole 125a in the lower plate surface portion (base portion) 114.

Furthermore, a position of the opening of the gas hole 114g on the sliding seal surface 114a is set at a position in which the opening is not closed when the electrode frame 110 and the slide plate 120 slide and move in position.

Therefore, the gas hole 114g can allow upper and lower sides of the sliding seal surface 114a of the lower plate surface portion (base portion) 114 and the sliding seal surface 120a of the slide plate 120 to communicate with each other.

Therefore, even when the electrode frame 110 and the slide plate 120 slide and move in position, a state of communicating between the U-shaped internal space 110A and the inside of the through hole 125a can be maintained. Accordingly, a state in which the recessed groove 125, the elongated hole 131, and the suspending groove 130 that communicate with the through hole 125a all communicate with the gas introduction space 101b can be maintained.

Also, a space that is close to the sliding seal surface 114a exposed at the opening of the through hole 125a also maintains a state of communicating with the gas introduction space 101b.

Therefore, also in the cleaning gas supply step (cleaning step) S05, inner surfaces of the through hole 125a, the recessed groove 125, the elongated hole 131, and the suspending groove 130, and the vicinity of the sliding seal surface 114a exposed at the opening of the through hole 125a are sealed with an Ar gas atmosphere and are not exposed to a cleaning gas.

In the present embodiment, the same effects as those in the above-described first embodiment can be achieved.

Furthermore, in the present embodiment, the stepped bolt 121 may have the gas hole 121g formed therein, or a dense stepped bolt 121 in which the gas holes 121g is not formed can also be used.

When the gas hole 121g of the stepped bolt 121 and the gas hole 114g of the lower plate surface portion (base portion) 114 are formed, a flow rate of Ar gas for sealing in the suspending groove 130 or the like can be increased.

Also, in the first embodiment, when the dense stepped bolt 121 is simply replaced with the stepped bolt 121 in which the gas hole 121g is formed, it is possible to seal the suspending groove 130 or the like with Ar gas.

EXAMPLE

Hereinafter, an example according to the present invention will be described.

A corrosion confirmation test will be described as a specific example of the method of cleaning the vacuum processing apparatus according to the present invention.

Experimental Example

Here, a degree of corrosion occurrence of the stepped bolt 121 disposed in the suspending groove 130 closed by the lid 136 as shown in FIG. 3 as a component exposed to a cleaning gas in the cleaning processing was verified.

As a cleaning processing test, in the cleaning gas supply step (cleaning step) S05 of the first embodiment described above, $NF_3$ (nitrogen trifluoride) was used as the cleaning gas, and cleaning using F radicals generated by the cleaning gas supply unit 149 was performed.

At the same time, the inside of the vacuum chamber 102 was evacuated using the vacuum pump 148.

Also, in the Ar gas filling step (purge step) S03 and the Ar gas sealing step (purge gas sealing step) S04, existence or non-existence of Ar sealing in which Ar gas as a purge gas is supplied and the suspending groove 130 is filled therewith was switched.

Here, cleaning was performed by changing materials of the slide plate 120 and the stepped bolt 121 and types of surface treatment. Also, the existence or non-existence of the Ar sealing was switched depending on the existence or non-existence of the gas hole 121g of the stepped bolt 121.

Also, a degree of corrosion was verified by laminating a film in which a-Si/SiO/SiN are laminated three times at a temperature of 450° C. of the support portion (heater) 141 and repeating cleaning 100 times.

Parameters in the cleaning processing test are shown below.

A material of the stepped bolt 121; Inconel 600, Hastelloy C22 aluminum diffusion processing condition: High temperature thermal processing (approximately) 1000° in an inert gas (Ar) atmosphere or a reducing gas ($H_2$) atmosphere.

$Y_2O_3$ film thickness: 100 nm

Purge gas; Ar

Purge gas flow rate; 35 SLM

Cleaning gas; F radicals by $NF_3$

Cleaning gas flow rate: 15 SLM

Cleaning time: 300 sec

Cleaning temperature: 450° C. (temperature of the heater 141)

Pressure of film deposition space 101a; 200 Pa

The results are shown in Table 1.

In the table, a symbol "○" indicates no change (excellent). A symbol "Δ" indicates that there is a change in color (acceptable). A symbol "×" indicates that there is corrosion (bad).

TABLE 1

| | Material | Surface treatment 1 | Surface treatment 2 | Without Ar sealing | With Ar sealing |
|---|---|---|---|---|---|
| Experimental example 1 | Inconel 600 | Electrolytic polishing | None | Δ | Δ |
| Experimental example 2 | Inconel 600 | None | Yttria coating | ○ | ○ |
| Experimental example 3 | Hastelloy C22 | Aluminum diffusion processing | None | × | × |
| Experimental example 4 | Hastelloy C22 | Aluminum diffusion processing | Yttria coating | ○ | ○ |

From the results shown in Table 1, it can be ascertained that corrosion does not occur when the yttria coating is applied. Also, it can be ascertained that corrosion does not occur when Ar sealing, that is, purging with the purge gas is performed.

INDUSTRIAL APPLICABILITY

As an application example of the present invention, as processing using a plasma, a plasma processing apparatus which performs a surface treatment of a substrate such as film deposition, particularly plasma CVD, or etching can be exemplified.

DESCRIPTION OF REFERENCE NUMERALS

100 Vacuum processing apparatus
101 Processing chamber
101a Film deposition space
101b Space (gas introduction space)
102 Vacuum chamber
103 Insulating flange
104 Electrode flange
104a Upper wall (electrode flange)
104b Circumferential wall (electrode flange)
105 Shower plate
105a Gas ejection port
106 Insulating shield
106a Thermal expansion absorption space (gap)
106b Gap
108 Movable shaft
109 Fixed shaft 110 Electrode frame
110A Internal space
111 Support member
112 Upper plate surface portion (fixed portion)
112a Notch
113 Vertical plate surface portion (wall portion)
114 Lower plate surface portion (base portion)
114a, 120a, 123a, 124b, 128a, 128b Sliding seal surface
117 Reflector
117a Screw
120 Slide plate
121 Stepped bolt (support member)
121a Bolt head
121b Shaft portion
121d Recess
121g, 121g1, 114g Gas hole
122 Side slide portion
123, 124, 128 Labyrinth protrusion
125 Recessed groove
125a Through hole
126 Leg portion
127 Corner slide portion
127a Fastening screw
130 Suspending groove
131 Elongated hole
132 Long slide member
133 Slide member
134, 135 Disc spring
136 Lid (cap)
136a Insertion portion
136c Inclined surface
136f Flange
137 Force-applying portion
137b Base portion
137s Elastic portion
137t Distal end
141 Support portion (heater)
142 Gas supply unit (gas supply means)
145 Support column
147 RF power supply (high-frequency power supply)
148 Vacuum pump (evacuation means)
149 Cleaning gas supply unit
S Substrate (processing-target substrate)

What is claimed is:

1. A vacuum processing apparatus which performs plasma processing, the vacuum processing apparatus comprising:
   an electrode flange connected to a high-frequency power supply;
   a shower plate spaced apart from and facing the electrode flange and serving as a cathode together with the electrode flange;
   an insulating shield provided around the shower plate;
   a processing chamber in which a processing-target substrate is to be disposed in an opposite side of the shower plate opposite with respect to the electrode flange;
   an electrode frame attached to the shower plate side of the electrode flange; and
   a slide plate attached to a circumferential edge portion of the shower plate on the electrode frame side, wherein
   the electrode frame and the slide plate are slidable in response to thermal deformation that occurs when a temperature of the shower plate is raised or lowered, and a space surrounded by the shower plate, the electrode flange, and the electrode frame is sealable,
   the shower plate is supported by the electrode frame using a support member penetrating through an elongated hole provided in the circumferential edge portion of the shower plate,
   the elongated hole is formed so that the support member is relatively movable in the elongated hole in response to thermal deformation that occurs when a temperature of the shower plate is raised or lowered,
   a gas hole which communicates with the elongated hole to supply a purge gas is provided in the elongated hole, and
   the gas hole communicates with a space surrounded by the shower plate, the electrode flange, the electrode frame, and the slide plate.

2. The vacuum processing apparatus according to claim 1, wherein the gas hole is formed to axially penetrate through the support member which penetrates through the elongated hole.

3. The vacuum processing apparatus according to claim 1, further comprising:
   a lid which closes an opening of the elongated hole, wherein the lid comprises a force-applying portion which applies a force to the lid such that it does not come away from the elongated hole when the opening of the elongated hole is closed.

4. The vacuum processing apparatus according to claim 1, wherein a portion exposed to a cleaning gas is subjected to a corrosion resistance surface treatment at the time of cleaning the processing chamber.

5. A method of cleaning a vacuum processing apparatus which is a method of cleaning the vacuum processing apparatus according to claim 1, the method comprising:
   supplying a purge gas into a space surrounded by the shower plate, the electrode flange, the electrode frame, and the slide plate;
   supplying a purge gas to the elongated hole through the gas hole;
   supplying a cleaning gas to the processing chamber; and
   supplying the cleaning gas to the processing chamber after the purge gas is supplied.

* * * * *